(12) United States Patent
Cha et al.

(10) Patent No.: US 12,652,910 B2
(45) Date of Patent: Jun. 9, 2026

(54) DISPLAY APPARATUS AND METHOD OF MANUFACTURING THE SAME

(71) Applicant: Samsung Display Co., Ltd., Yongin-si (KR)

(72) Inventors: Hyunji Cha, Yongin-si (KR); Haeyeon Lee, Yongin-si (KR); Yunkyeong In, Yongin-si (KR); Junyoung Jo, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 769 days.

(21) Appl. No.: 17/982,359

(22) Filed: Nov. 7, 2022

(65) Prior Publication Data

US 2023/0180555 A1     Jun. 8, 2023

(30) Foreign Application Priority Data

Dec. 7, 2021    (KR) ........................ 10-2021-0174012

(51) Int. Cl.
| | |
|---|---|
| *H10K 59/131* | (2023.01) |
| *H10K 71/00* | (2023.01) |
| *H10K 59/12* | (2023.01) |
| *H10K 59/35* | (2023.01) |

(52) U.S. Cl.
CPC ........... *H10K 59/131* (2023.02); *H10K 71/00* (2023.02); *H10K 59/1201* (2023.02); *H10K 59/35* (2023.02)

(58) Field of Classification Search
CPC .............................. H10K 59/131; H10K 71/00
See application file for complete search history.

(56) References Cited

U.S. PATENT DOCUMENTS

| | | | |
|---|---|---|---|
| 9,219,105 | B2 | 12/2015 | Jung |
| 9,941,340 | B2 | 4/2018 | Lee et al. |
| 10,510,822 | B2 | 12/2019 | Kim et al. |
| 10,591,766 | B2 | 3/2020 | Cheng et al. |
| 10,707,285 | B2 | 7/2020 | Kwon et al. |
| 10,890,761 | B2 | 1/2021 | Kim et al. |
| 11,417,711 | B2 | 8/2022 | Park et al. |
| 12,089,455 | B2 | 9/2024 | Bang et al. |
| 2018/0342570 | A1* | 11/2018 | Hong ................... H10K 59/353 |

(Continued)

FOREIGN PATENT DOCUMENTS

| | | |
|---|---|---|
| KR | 10-1621661 B1 | 5/2016 |
| KR | 10-2016-0100050 A | 8/2016 |

(Continued)

*Primary Examiner* — Douglas M Menz
(74) *Attorney, Agent, or Firm* — Womble Bond Dickinson (US) LLP

(57) ABSTRACT

A display apparatus includes: a substrate; a first display element having a first emission area configured to emit light of a first color; first and second data lines between the substrate and the first display element, extending in a first direction, and overlapping at least a portion of the first emission area; and first and second auxiliary electrodes between the substrate and the first display element, overlapping at least a portion of the first emission area, and configured to receive a driving voltage, wherein a length-wise direction of the first and second auxiliary electrodes is the first direction, and wherein the first and second data lines are between the first and second auxiliary electrodes spaced apart from each other in a second direction.

15 Claims, 21 Drawing Sheets

(56) References Cited

U.S. PATENT DOCUMENTS

| | | | |
|---|---|---|---|
| 2021/0193765 A1* | 6/2021 | Kim | H10K 59/8792 |
| 2022/0208902 A1* | 6/2022 | Kim | H10K 59/88 |

FOREIGN PATENT DOCUMENTS

| | | |
|---|---|---|
| KR | 10-2018-0030365 A | 3/2018 |
| KR | 10-2018-0064988 A | 6/2018 |
| KR | 10-2018-0125084 A | 11/2018 |
| KR | 10-2157762 B1 | 9/2020 |
| KR | 10-2020-0111859 A | 10/2020 |
| KR | 10-2021-0077862 A | 6/2021 |

* cited by examiner

DISPLAY APPARATUS AND METHOD OF MANUFACTURING THE SAME

CROSS-REFERENCE TO RELATED APPLICATION

The present application claims priority to and the benefit of Korean Patent Application No. 10-2021-0174012, filed on Dec. 7, 2021, in the Korean Intellectual Property Office, the entire disclosure of which is incorporated herein by reference.

BACKGROUND

1. Field

Aspects of one or more embodiments relate to a display apparatus and a method of manufacturing a display apparatus.

2. Description of the Related Art

A display apparatus visually displays data. A display apparatus is used as a display unit of various portable electronic devices such as mobile phones, and may also be used as a display unit of large-scale products such as televisions.

A display apparatus includes a plurality of pixels that receive electric signals and emit light to display images to outside. Each pixel includes a display element. An organic light-emitting display apparatus includes, for example, an organic light-emitting diode. Generally, an organic light-emitting display apparatus includes a thin-film transistor and an organic light-emitting diode over a substrate, and operates while the organic light-emitting diode emits light in response to data signals.

Recently, as the uses for display apparatuses have become more diversified, various designs to improve the quality of the display apparatus have been attempted.

The above information disclosed in this Background section is only for enhancement of understanding of the background and therefore the information discussed in this Background section does not necessarily constitute prior art.

SUMMARY

Aspects of one or more embodiments include a display apparatus with an insulating layer having relatively improved flatness and a method of manufacturing a display apparatus.

Technical characteristics of embodiments according to the present disclosure are not limited to the technical characteristics mentioned above, and other technical characteristics that are not mentioned will be more clearly understood by those of ordinary skill in the art from the description of the present disclosure.

Additional aspects will be set forth in part in the description which follows and, in part, will be apparent from the description, or may be learned by practice of the presented embodiments of the disclosure.

According to one or more embodiments, a display apparatus includes a substrate, a first display element having a first emission area that emits light of a first color, first and second data lines between the substrate and the first display element, extending in a first direction, and overlapping at least a portion of the first emission area, and first and second auxiliary electrodes between the substrate and the first display element, overlapping at least a portion of the first emission area, and to which a driving voltage is applied, wherein a lengthwise direction of the first and second auxiliary electrodes is the first direction, and wherein the first and second data lines are between the first and second auxiliary electrodes apart from each other in a second direction.

According to some embodiments, the display apparatus may further include first and second power lines between the substrate and the first display element, extending in the first direction, and to which the driving voltage is applied, wherein the first and second data lines and the first and second auxiliary electrodes may be between the first and second power lines apart from each other in the second direction, wherein the first auxiliary electrode may extend from the first power line, and wherein the second auxiliary electrode may extend from the second power line.

According to some embodiments, the display apparatus may further include a connection electrode between the substrate, and the first and second data lines, the first and second auxiliary electrodes, and having a region overlapping the first emission area entirely.

According to some embodiments, the connection electrode may connect the first power line to the second power line.

According to some embodiments, the display apparatus may further include a second display element having a second emission area configured to emit light of a second color, and a third display element having a third emission area configured to emit light of a third color, wherein the first power line may have a region that overlaps the second emission area entirely, and wherein the second power line may have a region that overlaps the third emission area entirely.

According to some embodiments, the display apparatus may further include a pixel circuit between the substrate and the first display element, configured to receive a data voltage through the first data line, generate a driving current having a size determined based on the driving voltage and the data voltage, and output the driving current to the first display element.

According to some embodiments, the display apparatus may further include first and second power lines between the substrate and the first display element, extending in the first direction, and to which the driving voltage is applied, wherein the first auxiliary electrode may have a first end and a second end, and at least one of the first end or the second end may be coupled to the first power line, and wherein the second auxiliary electrode may have a first end and a second end, and at least one of the first end or the second end may be coupled to the second power line.

According to some embodiments, the display apparatus may further include a first insulating layer between the substrate and the first display element, and a second insulating layer between the first insulating layer and the first display element, wherein the first and second data lines, and the first and second auxiliary electrodes may be between the first insulating layer and the second insulating layer, and wherein a first distance between an upper surface of the first data line and an upper surface of the second insulating layer may be less than a second distance between an upper surface of the first insulating layer and the upper surface of the second insulating layer.

According to some embodiments, the display apparatus may further include a color filter layer on the first display element and overlapping the first emission area, and a light-blocking layer exposing at least a portion of the color filter layer.

According to some embodiments, the first auxiliary electrode, the first data line, the second data line, and the second auxiliary electrode may be apart from each other in the second direction, wherein a first separation distance between the first auxiliary electrode and the first data line, a second separation distance between the first data line and the second data line, and a third separation distance between the second auxiliary electrode and the second data line may be substantially same.

According to some embodiments, a width of each of the first and second data lines may be substantially same as a width of each of the first and second auxiliary electrodes.

According to some embodiments, a width of each of the first and second data lines may be greater than a width of each of the first and second auxiliary electrodes.

According to some embodiments, the display apparatus may further include third and fourth auxiliary electrodes between the substrate and the first display element, overlapping at least a portion of the first emission area, and to which a driving voltage is applied, wherein a lengthwise direction of the third and fourth auxiliary electrodes is the first direction, wherein the first and second data lines, the first and second auxiliary electrodes may be between the third and fourth auxiliary electrodes apart from each other in the second direction.

According to some embodiments, a width of each of the first and second auxiliary electrodes may be greater than a width of each of the third and fourth auxiliary electrodes.

According to some embodiments, the first auxiliary electrode and the first data line may be substantially symmetric with the second auxiliary electrode and the second data line with respect to a line of symmetry passing through a central portion of the first emission area.

According to one or more embodiments, a display apparatus includes a substrate, a plurality of first pixel circuits arranged in a first direction on the substrate, a power line extending in the first direction and configured to transfer a driving voltage to the plurality of first pixel circuits, and a plurality of first display elements on the power line, electrically connected to the plurality of first pixel circuits, and each having a first emission area that emits light of a first color, wherein the power line has a plurality of first overlapping portions that overlap each of the plurality of first emission areas, entirely.

According to some embodiments, the display apparatus may further include a plurality of second pixel circuits alternately arranged with the plurality of first pixel circuits in the first direction on the substrate, and a plurality of second display elements alternately arranged with the plurality of first display elements in the first direction on the power line, electrically connected to the plurality of second pixel circuits, and each having a second emission area that emits light of a second color, wherein the power line may be configured to transfer the driving voltage to the plurality of second pixel circuits, and having a plurality of overlapping portions that overlap each of the plurality of second emission areas, entirely.

According to some embodiments, the display apparatus may further include an insulating layer between the substrate and the power line, wherein the power line may have a plurality of holes arranged between a first display element and a second display element and exposing a portion of the insulating layer, wherein the first display element and the second display element may be adjacent to each other in the first direction among the plurality of first display elements and the plurality of second display elements.

According to some embodiments, the display apparatus may further include a plurality of third pixel circuits arranged in the first direction on the substrate, and a plurality of third display elements arranged in the first direction, electrically connected to the plurality of third pixel circuits, and each having a third emission area that emits light of a third color, wherein the power line may be configured to transfer the driving voltage to the plurality of third pixel circuits, and wherein the plurality of holes may be adjacent to the plurality of third display elements in a second direction.

According to some embodiments, the display apparatus may further include a plurality of auxiliary electrodes extending from the power line and each overlapping at least a portion of the plurality of third emission areas.

According to one or more embodiments, a method of manufacturing a display apparatus including a first display element having a first emission area that emits light of a first color, and a second display element having a second emission area that emits light of a second color includes forming a first insulating material layer on a substrate, preparing a first slit mask having a plurality of first slits formed in positions corresponding to the first emission area, and a plurality of second slits formed in positions corresponding to the second emission area, and forming a first insulating layer by partially removing a first part of the first insulating material layer corresponding to the first emission area and partially removing a second part of the first insulating material layer corresponding to the second emission area by using the first slit mask.

According to some embodiments, a lengthwise direction of each of the plurality of first slits may be a first direction, and a lengthwise direction of each of the plurality of second slits may be a second direction crossing the first direction.

According to some embodiments, the method may further include forming a second insulating material layer on the first insulating layer, preparing a second slit mask having a plurality of third slits formed in positions corresponding to the first emission area, and forming a second insulating layer by partially removing a first part of the second insulating material layer corresponding to the first emission area by using the second slit mask.

According to some embodiments, a width of each of the plurality of first slits may be different from a width of each of the plurality of third slits.

According to some embodiments, the method may further include forming the first and second display elements on the second insulating layer.

These and/or other aspects will become more apparent and more readily appreciated from the following description of the embodiments, the accompanying drawings, and claims.

These general and specific aspects may be implemented by using a system, a method, a computer program, or a combination of a certain system, method, and computer program.

BRIEF DESCRIPTION OF THE DRAWINGS

The above and other aspects, features, and characteristics of certain embodiments of the disclosure will be more apparent from the following description taken in conjunction with the accompanying drawings, in which:

FIG. 4 is a cross-sectional view of a portion of a display apparatus, taken along the line I-I' of FIG. 3;

FIG. 6 is a cross-sectional view of a portion of a display apparatus, taken along the line I-I' of FIG. 3;

FIG. 7 is a cross-sectional view of a portion of a display apparatus, taken along the line I-I' of FIG. 3;

FIG. 16 is a cross-sectional view of a portion of a display apparatus, taken along the line V-V' of FIG. 14; and FIGS. 17 to 21 are views for explaining a method of manufacturing a display apparatus according to some embodiments.

DETAILED DESCRIPTION

Figure 1:
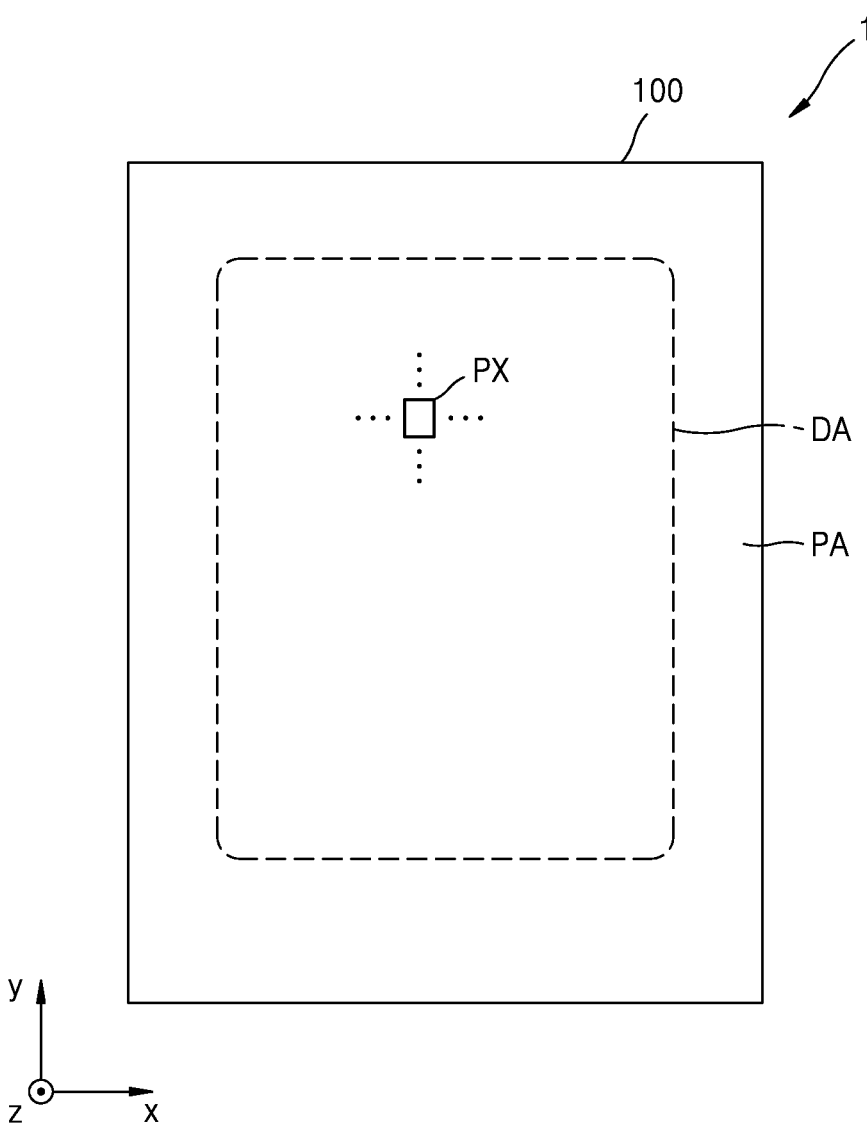
FIG. 1 is a schematic plan view of a display apparatus according to some embodiments.

Reference will now be made in more detail to aspects of some embodiments, which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

As embodiments according to the present disclosure allow for various changes and numerous embodiments, certain embodiments will be illustrated in the drawings and described in the written description. Effects and features of the disclosure, and methods for achieving them will be clarified with reference to embodiments described below in more detail with reference to the drawings. However, the disclosure is not limited to the following embodiments and may be embodied in various forms.

Hereinafter, aspects of some embodiments will be described with reference to the accompanying drawings, wherein like reference numerals refer to like elements throughout and a repeated description thereof is omitted.

While such terms as "first" and "second" may be used to describe various components, such components must not be limited to the above terms. The above terms are used to distinguish one component from another.

The singular forms "a," "an," and "the" as used herein are intended to include the plural forms as well unless the context clearly indicates otherwise.

It will be understood that the terms "comprise," "comprising," "include" and/or "including" as used herein specify the presence of stated features or components but do not preclude the addition of one or more other features or components.

It will be further understood that, when a layer, region, or component is referred to as being "on" another layer, region, or component, it can be directly or indirectly on the other layer, region, or component. That is, for example, intervening layers, regions, or components may be present.

Sizes of elements in the drawings may be exaggerated or reduced for convenience of explanation. For example, since sizes and thicknesses of elements in the drawings are arbitrarily illustrated for convenience of explanation, the disclosure is not limited thereto.

In the case where a certain embodiment may be implemented differently, a specific process order may be performed in the order different from the described order. As an example, two processes that are successively described may be substantially simultaneously performed or performed in the order opposite to the order described.

In the present specification, "A and/or B" means A or B, or A and B. In the present specification, "at least one of A and B" means A or B, or A and B.

It will be understood that when a layer, region, or component is referred to as being "connected" to another layer, region, or component, it may be "directly connected" to the other layer, region, or component or may be "indirectly connected" to the other layer, region, or component with other layer, region, or component interposed therebetween. For example, it will be understood that when a layer, region, or component is referred to as being "electrically connected" to another layer, region, or component, it may be "directly electrically connected" to the other layer, region, or component or may be "indirectly electrically connected" to other layer, region, or component with other layer, region, or component interposed therebetween.

The x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

FIG. 1 is a schematic plan view of a display apparatus 1 according to some embodiments.

Referring to FIG. 1, the display apparatus 1 includes a display area DA configured to display images and a peripheral area PA arranged around (e.g., outside a periphery of) the display area DA. The display apparatus 1 may display images to the outside by using light emitted from pixels in the display area DA.

The display apparatus 1 includes a substrate 100. The substrate 100 may include various materials such as glass, metal, or plastic. According to some embodiments, the substrate 100 may include a flexible material. Here, the flexible material may be a material that is easily warped, bendable, foldable, or rollable. As an example, the flexible material may include ultra-thin glass, metal, or plastic.

Pixels PX including various display elements such as an organic light-emitting diode OLED may be arranged in the display area DA of the substrate 100. The pixel PX may be provided in plurality. The plurality of pixels PX may be arranged in various configurations such as a stripe configuration, a pentile configuration, a mosaic configuration, and the like to display images.

In a plan view, the display area DA may be arranged in a rectangular shape as shown in FIG. 1. According to some embodiments, the display area DA may be arranged in a polygonal shape such as a triangle, a pentagon, a hexagon, and the like, a circular shape, an elliptical shape, an irregular shape, or the like.

The peripheral area PA of the substrate 100 is a region arranged around the display area DA and may be a region in which images are not displayed. Pads may be arranged in the peripheral area PA, wherein various wirings, a printed circuit board or a driver integrated circuit (IC) chip configured to transfer electric signals to the display area DA are attached to the pads.

Figure 2:
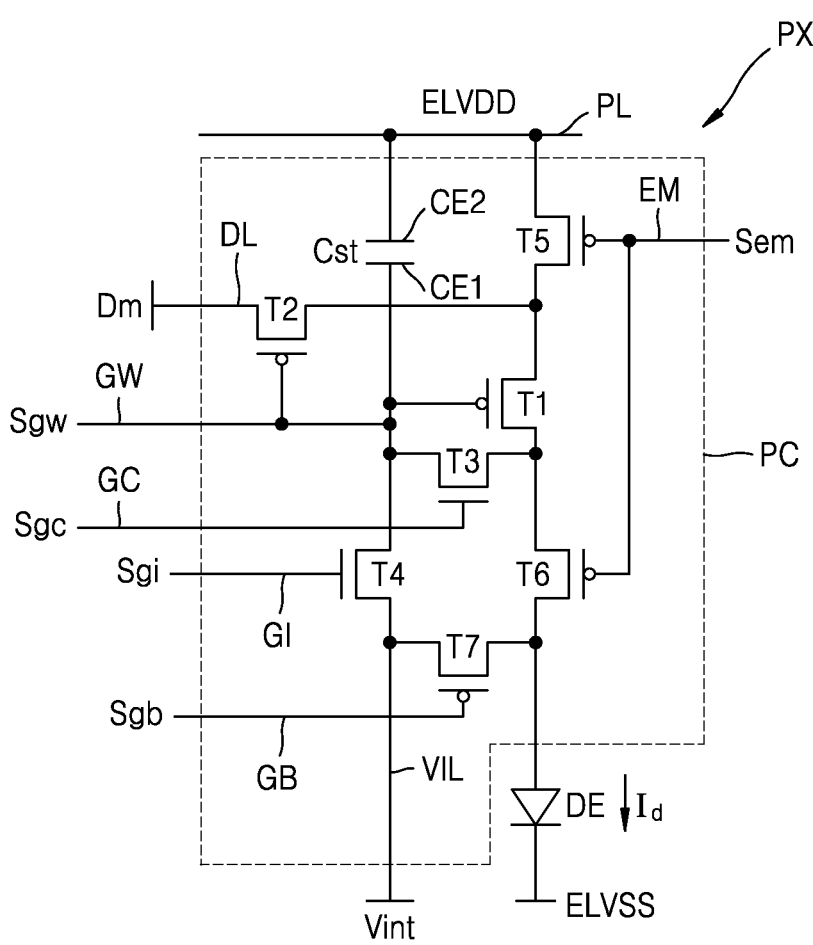
FIG. 2 is a schematic equivalent circuit diagram of a pixel according to some embodiments.

FIG. 2 is a schematic equivalent circuit diagram of a pixel according to some embodiments.

Referring to FIG. 2, a pixel PX may include a pixel circuit PC and a display element DE electrically connected to the pixel circuit PC. As an example, the display element DE may be an organic light-emitting diode OLED.

As shown in FIG. 2, the pixel circuit PC may include a plurality of thin-film transistors T1, T2, T3, T4, T5, T6, and T7 and a storage capacitor Cst. The plurality of thin-film transistors T1, T2, T3, T4, T5, T6, and T7 and the storage capacitor Cst may be connected to signal lines GW, GC, GI, GB, EM, and DL, an initialization voltage line VIL, and a power line PL. According to some embodiments, at least one of the signal lines GW, GC, GI, GB, EM, or DL, the initialization voltage line VIL, and/or the power line PL may be shared by pixels PX adjacent to each other.

The thin-film transistors may include a driving thin-film transistor T1, a scan thin-film transistor T2, a compensation thin-film transistor T3, a gate initialization thin-film transistor T4, an operation control thin-film transistor T5, an emission control thin-film transistor T6, and an anode initialization thin-film transistor T7.

Some of the plurality of thin-film transistors T1, T2, T3, T4, T5, T6, and T7 may be n-channel metal-oxide semiconductor (NMOS) field-effect transistors (n-channel MOSFET), and the rest may be p-channel metal-oxide semiconductor (PMOS) field-effect transistors (p-channel MOSFET). As an example, as shown in FIG. 2, among the plurality of thin-film transistors T1, T2, T3, T4, T5, T6, and T7, the compensation thin-film transistor T3 and the first initialization thin-film transistor T4 may be n-channel MOSFET(NMOS), and the rest may be p-channel MOSFET (PMOS).

According to some embodiments, among the plurality of thin-film transistors T1, T2, T3, T4, T5, T6, and T7, the compensation thin-film transistor T3, the gate initialization thin-film transistor T4, and the anode initialization thin-film transistor T7 may be n-channel MOSFET(NMOS), and the rest may be p-channel MOSFET(PMOS). Alternatively, only one of the plurality of thin-film transistors T1, T2, T3, T4, T5, T6, and T7 may be n-channel MOSFET(NMOS) and the rest may be p-channel MOSFET(PMOS). Alternatively, all of the plurality of thin-film transistors T1, T2, T3, T4, T5, T6, and T7 may be n-channel MOSFET(NMOS). Alternatively, all of the plurality of thin-film transistors T1, T2, T3, T4, T5, T6, and T7 may be p-channel MOSFET(PMOS).

The signal lines include a scan line GW, a compensation gate line GC, an initialization gate line GI, an emission control line EM, a next scan line GB, and a data line DL, wherein the scan line GW is configured to transfer scan signals Sgw, the compensation gate line GC is configured to transfer compensation signals Sgc, the initialization gate line GI is configured to transfer initialization signals Sgi to the gate initialization thin-film transistor T4, the emission control line EM is configured to transfer emission control signals Sem to the operation control thin-film transistor T5 and the emission control thin-film transistor T6, the next scan line GB is configured to transfer next scan signals Sgb to the anode initialization thin-film transistor T7, and the data line DL crosses the scan line GW and is configured to transfer a data voltage Dm.

The power line PL is configured to transfer a driving voltage ELVDD to the driving thin-film transistor T1, and the initialization voltage line VIL is configured to transfer an initialization voltage Vint initializing the driving thin-film transistor T1 and an anode.

A gate of the driving thin-film transistor T1 is connected to the storage capacitor Cst, a source of the driving thin-film transistor T1 is connected to the power line PL through the operation control thin-film transistor T5, and a drain of the driving thin-film transistor T1 is electrically connected to the anode of the organic light-emitting diode OLED through the emission control thin-film transistor T6.

The driving thin-film transistor T1 is configured to receive a data voltage Dm and to supply a driving current $I_d$ to the display element DE according to a switching operation of the scan thin-film transistor T2.

A gate of the scan thin-film transistor T2 is connected to the scan line GW, a source of the scan thin-film transistor T2 is connected to the data line DL, and a drain of the scan thin-film transistor T2 is connected to the source of the driving thin-film transistor T1 and connected to the power line PL through the operation control thin-film transistor T5. The scan thin-film transistor T2 is turned on according to a scan signal Sgw transferred through the scan line GW and performs a switching operation of transferring a data voltage Dm to the source of the driving thin-film transistor T1, wherein the data voltage Dm is transferred to the data line DL.

A gate of the compensation thin-film transistor T3 is connected to a compensation gate line GC. A drain of the compensation thin-film transistor T3 is connected to the drain of the driving thin-film transistor T1 and connected to the anode of the display element DE through the emission control thin-film transistor T6. A source of the compensation thin-film transistor T3 is connected to a lower electrode CE1 of the storage capacitor Cst and the gate of the driving thin-film transistor T1. In addition, the source of the compensation thin-film transistor T3 is connected to a drain of the gate initialization thin-film transistor T4. The compensation thin-film transistor T3 is turned on according to a compensation signal Sgc transferred through the compensation gate line GC, and diode-connects the driving thin-film transistor T1 by electrically connecting the gate of the driving thin-film transistor T1 to the drain of the driving thin-film transistor T1.

A gate of the gate initialization thin-film transistor T4 is connected to the initialization gate line GI. A source of the gate initialization thin-film transistor T4 is connected to a source of the anode initialization thin-film transistor T7 and the initialization voltage line VIL. A drain of the gate initialization thin-film transistor T4 is connected to the lower electrode CE1 of the storage capacitor Cst, the source of the compensation thin-film transistor T3, and the gate of the driving thin-film transistor T1. The gate initialization thin-film transistor T4 is turned on according to an initialization signal Sgi transferred through the initialization gate line GI and performs an initialization operation of initializing a voltage of the gate of the driving thin-film transistor T1 by transferring the initialization voltage Vint to the gate of the driving thin-film transistor T1.

A gate of the operation control thin-film transistor T5 is connected to the emission control line EM, a source of the operation control thin-film transistor T5 is connected to the power line PL, and a drain of the operation control thin-film transistor T5 is connected to the source of the driving thin-film transistor T1 and the drain of the scan thin-film transistor T2.

A gate of the emission control thin-film transistor T6 is connected to the emission control line EM, a source of the emission control thin-film transistor T6 is connected to the drain of the driving thin-film transistor T1 and the drain of the compensation thin-film transistor T3, and a drain of the emission control thin-film transistor T6 is electrically connected to a drain of the anode initialization thin-film transistor T7 and the anode of the display element DE.

The operation control thin-film transistor T5 and the emission control thin-film transistor T6 are simultaneously turned on according to an emission control signal Sem transferred through the emission control line EM, and the driving voltage ELVDD is transferred to the display element DE, and thus, the driving current $I_d$ flows through the display element DE.

A gate of the anode initialization thin-film transistor T7 is connected to the next scan line GB, a drain of the anode initialization thin-film transistor T7 is connected to the drain of the emission control thin-film transistor T6 and the anode of the display element DE, and a source of the anode initialization thin-film transistor T7 is connected to the source of the gate initialization thin-film transistor T4 and the initialization voltage line VIL. The anode initialization thin-film transistor T7 is turned on according to a next scan signal Sgb transferred through the next scan line GB and initializes the anode of the display element DE.

A next scan signal Sgb may be substantially synchronized with a scan signal Sgw. As another example, a next scan signal Sgb may be substantially synchronized with a scan signal Sgw on a next row. As an example, a next scan line GB may be substantially the same as a scan line GW on a next row. The pixels PX adjacent to each other in a column direction may share the scan line GW.

The anode initialization thin-film transistor T7 may be connected to the next scan line GB as shown in FIG. 2. According to some embodiments, the anode initialization thin-film transistor T7 may be connected to the emission control line EM and driven according to an emission control signal Sem. The positions of a source and a drain of each of the thin-film transistors may be exchanged depending on the type (a p-type or an n-type) of the transistor.

The storage capacitor Cst may include the lower electrode CE1 and an upper electrode CE2. The lower electrode CE1 of the storage capacitor Cst is connected to the gate of the driving thin-film transistor T1, and the upper electrode CE2 of the storage capacitor Cst is connected to the power line PL. The storage capacitor Cst may be configured to store charge corresponding to a difference between the gate voltage of the driving thin-film transistor T1 and the driving voltage ELVDD.

According to some embodiments, the pixel circuit PC may include a boost capacitor including a first electrode and a second electrode. The first electrode of the boost capacitor may be connected to the gate of the scan thin-film transistor T2 and the scan line GW, and the second electrode may be connected to the source of the compensation thin-film transistor T3.

Hereinafter, a specific operation of a pixel PX of the display apparatus according to some embodiments is described in more detail. As shown in FIG. 2, it is assumed that the compensation thin-film transistor T3 and the gate initialization thin-film transistor T4 are n-type MOSFET, and the rest are p-type MOSFET.

First, when an emission control signal Sem of a high level is received, the operation control thin-film transistor T5 and the emission control thin-film transistor T6 are turned off, the driving thin-film transistor T1 stops outputting of the driving current $I_d$, and the display element DE stops emitting light.

Then, during an initialization period, when an initialization signal Sgi is supplied through the initialization gate line GI, the gate initialization thin-film transistor T4 is turned on according to the initialization signal Sgi, and the driving thin-film transistor T1 is initialized by the initialization voltage Vint supplied from the initialization voltage line VIL.

Then, during a data programming period, when a scan signal Sgw and a compensation signal Sgc are supplied through the scan line GW and the compensation gate line GC, the scan thin-film transistor T2 and the compensation thin-film transistor T3 are turned on according to a scan signal Sgw and a compensation signal Sgc. In this case, the driving thin-film transistor T1 is diode-connected and forward-biased by the compensation thin-film transistor T3 that is turned on.

Then, a compensation voltage Dm+Vth (Vth has a −value) is applied to the gate of the driving thin-film transistor T1, wherein the compensation voltage Dm+Vth is a voltage reduced by a threshold voltage Vth of the driving thin-film transistor T1 from a data voltage Dm supplied from the data line DL.

The driving voltage ELVDD and the compensation voltage Dm+Vth are respectively applied to two opposite ends of the storage capacitor Cst, and charge corresponding to a difference between voltages of the two opposite ends is stored in the storage capacitor Cst.

Then, during an emission period, the operation control thin-film transistor T5 and the emission control thin-film transistor T6 are turned on according to an emission control signal Sem supplied from the emission control line EM. The driving current $I_d$ corresponding to a voltage difference between the gate voltage of the driving thin-film transistor T1 and the driving voltage ELVDD occurs, and the driving current $I_d$ is supplied to the display element DE through the emission control thin-film transistor T6.

According to some embodiments, at least one of the plurality of thin-film transistors T1, T2, T3, T4, T5, T6, or T7 may include a semiconductor layer including oxide, and the rest may include a semiconductor layer including silicon.

For example, the driving thin-film transistor T1 directly influencing the brightness of the display apparatus may be configured to include a semiconductor layer including polycrystalline silicon having high reliability, and thus, a high-resolution display apparatus may be implemented through this configuration.

Because an oxide semiconductor has high carrier mobility and a low leakage current, a voltage drop is not large even when a driving time is long. That is, because a color change of an image due to a voltage drop is not large even when a display apparatus is driven at low frequencies, the display apparatus may be driven at low frequencies.

Because the oxide semiconductor may have a relatively low leakage current, at least one of the compensation thin-film transistor T3, the gate initialization thin-film transistor T4, or the anode initialization thin-film transistor T7 connected to the gate of the driving thin-film transistor T1 may include an oxide semiconductor, and thus, a leakage current that may flow to the gate of the driving thin-film transistor T1 may be prevented or reduced, and simultaneously, power consumption may be reduced.

Though it is described with reference to FIG. 2 that the pixel circuit PC includes seven transistors and one storage capacitor, the embodiments are not limited thereto. According to some embodiments, the pixel circuit PC may include two transistors and one storage capacitor.

Figure 3:
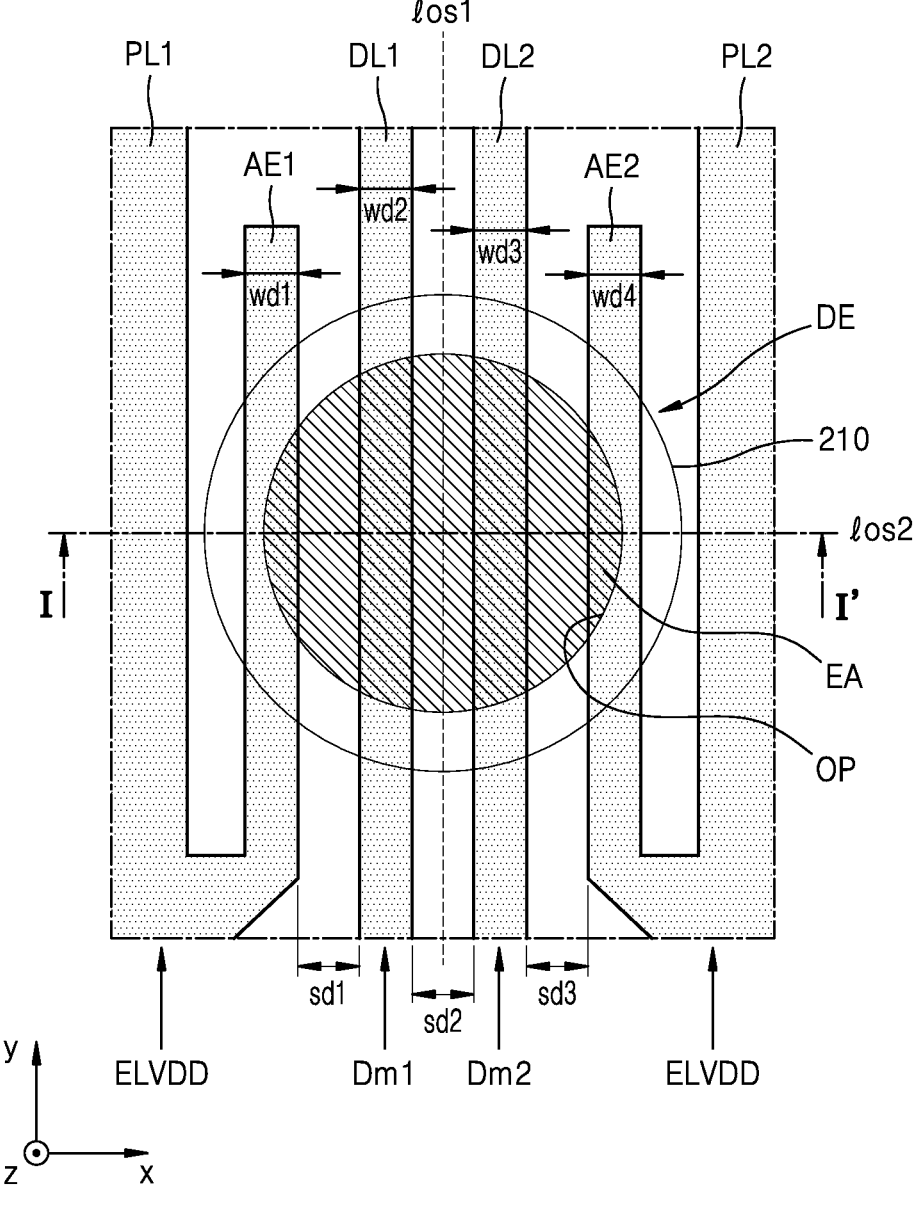
FIG. 3 is an enlarged plan view of a display apparatus according to some embodiments.

FIG. 3 is an enlarged plan view of the display apparatus 1 according to some embodiments.

Figure 4:
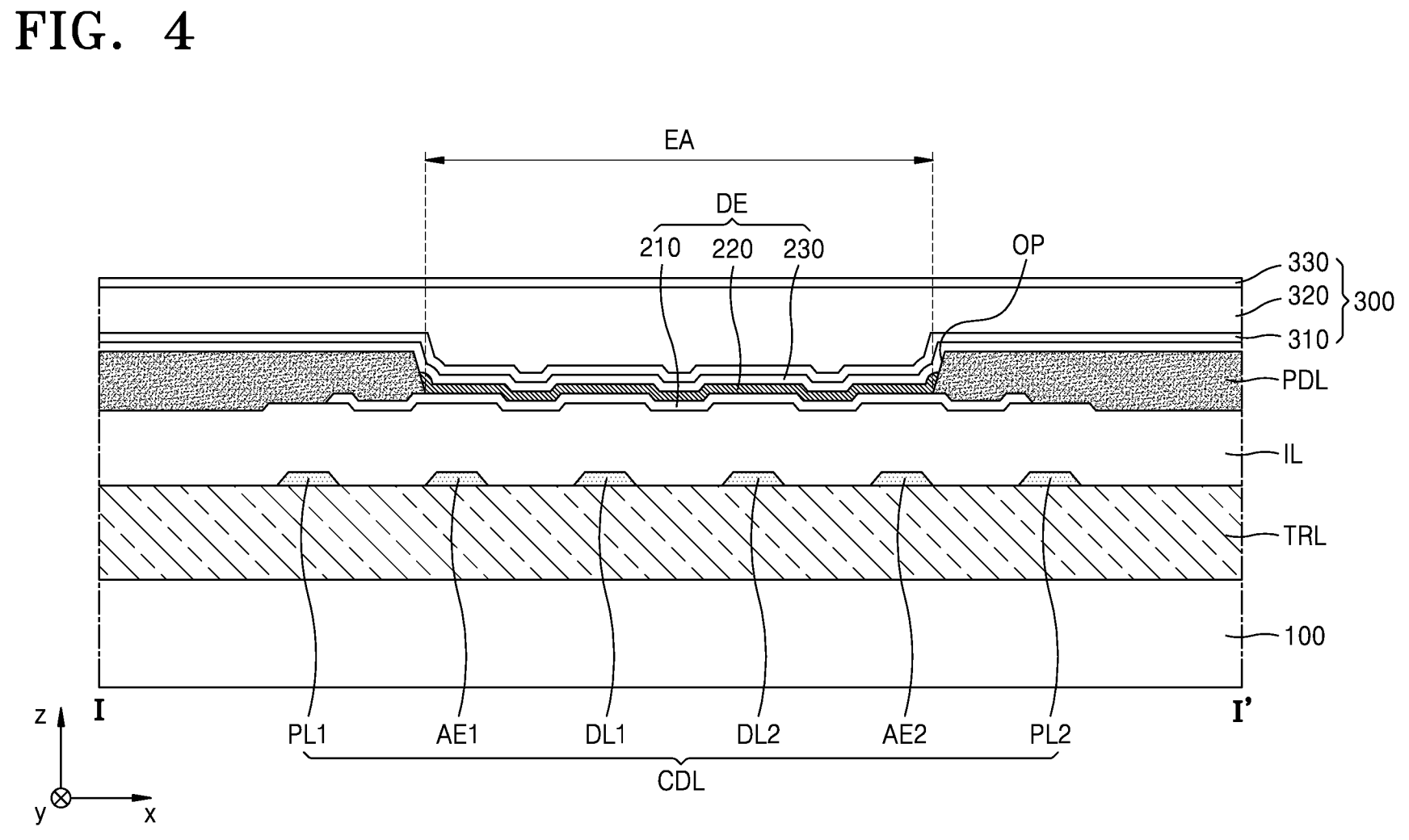

Referring to FIG. 3, the display apparatus 1 (see FIG. 1) may include the display element DE. The display element DE may include a pixel electrode 210 and an emission area EA configured to emit light. As shown in FIG. 4 below, the emission area EA may be defined by an opening OP of a pixel-defining layer PDL that exposes at least a portion of the pixel electrode 210.

Though it is shown in FIG. 3 that the pixel electrode 210 has a circular shape in a plan view, embodiments according to the present disclosure are not limited thereto, and the pixel electrode 210 may have various shapes such as a polygonal shape including an octagon, a diamond shape and the like, an elliptical shape and the like according to some embodiments. In addition, though it is shown in FIG. 3 that the emission area EA has a circular shape in a plan view, the emission area EA may have various shapes such as a polygonal shape including an octagon, a diamond shape and the like, an elliptical shape and the like according to some embodiments.

The display apparatus 1 may include a first data line DL1, a second data line DL2, a first auxiliary electrode AE1, a second auxiliary electrode AE2, a first power line PL1, and a second power line PL2. The first data line DL1, the second data line DL2, the first auxiliary electrode AE1, the second auxiliary electrode AE2, the first power line PL1, and the second power line PL2 may be located below the display element DE. The first data line DL1, the second data line DL2, the first auxiliary electrode AE1, and the second auxiliary electrode AE2 may be arranged between the first power line PL1 and the second power line PL2 apart from each other in a second direction (e.g., a ±x direction). The first data line DL1 and the second data line DL2 may be arranged between the first auxiliary electrode AE1 and the second auxiliary electrode AE2 apart from each other in the second direction (e.g., the ±x direction).

The first data line DL1 may extend in a first direction (e.g., a ±y direction) and overlap at least a portion of the emission area EA. A first data voltage Dm1 may be applied to the first data line DL1, and the first data line DL1 may be configured to transfer the first data voltage Dm1 to pixel circuits located on the same column.

The second data line DL2 may extend in the first direction (e.g., the ±y direction) and overlap at least a portion of the emission area EA. A second data voltage Dm2 may be applied to the second data line DL2, and the second data line DL2 may be configured to transfer the second data voltage Dm2 to pixel circuits located on the same column.

The lengthwise direction of the first auxiliary electrode AE1 is the first direction (e.g., the ±y direction) and may overlap at least a portion of the emission area EA. The first auxiliary electrode AE1 may be arranged side by side with (or in parallel to) the first data line DL1. The driving voltage ELVDD may be applied to the first auxiliary electrode AE1.

The lengthwise direction of the second auxiliary electrode AE2 is the first direction (e.g., the ±y direction) and may overlap at least a portion of the emission area EA. The second auxiliary electrode AE2 may be arranged side by side with (or in parallel to) the second data line DL2. The driving voltage ELVDD may be applied to the second auxiliary electrode AE2.

The first power line PL1 and the second power line PL2 may each extend in the first direction (e.g., the ±y direction). The driving voltage ELVDD may be applied to the first power line PL1 and the second power line PL2.

According to some embodiments, the first auxiliary electrode AE1 may extend from the first power line PL1, and the second auxiliary electrode AE2 may extend from the second power line PL2. The first auxiliary electrode AE1 may extend from one side of the first power line PL1, and the second auxiliary electrode AE2 may extend from one side of the second power line PL2 facing the one side of the first power line PL1.

According to some embodiments, a first separation distance sd1 between the first auxiliary electrode AE1 and the first data line DL1, a second separation distance sd2 between the first data line DL1 and the second data line DL2, and a third separation distance sd3 between the second data line DL2 and the second auxiliary electrode AE2 may be substantially the same.

According to some embodiments, the width of each of the first data line DL1 and the second data line DL2 may be substantially the same as the width of each of the first auxiliary electrode AE1 and the second auxiliary electrode AE2. That is, a first width wd1 of the first auxiliary electrode AE1, a second width wd2 of the first data line DL1, a third width wd3 of the second data line DL2, and a fourth width wd4 of the second auxiliary electrode AE2 may be substantially the same.

According to some embodiments, the first auxiliary electrode AE1 and the first data line DL1 may be respectively symmetric with the second auxiliary electrode AE2 and the second data line DL2 with respect to a first line of symmetry los1. The first line of symmetry los1 may pass through the central portion of the emission area EA and extend in the first direction (e.g., the ±y direction).

In addition, when viewing only a portion corresponding to the emission area EA, the first auxiliary electrode AE1 and the first data line DL1 may be respectively symmetric with the second auxiliary electrode AE2 and the second data line DL2 with respect to a second line of symmetry los2. The second line of symmetry los2 may pass through the central portion of the emission area EA and extend in the second direction (e.g., the ±x direction).

According to some embodiments, in the case where the first data line DL1, the second data line DL2, the first auxiliary electrode AE1, and the second auxiliary electrode AE2 are arranged below the display element DE with an equal interval, the flatness of an insulating layer IL under the pixel electrode 210 may improve as shown in FIG. 4 below. The flatness of the insulating layer IL may be reduced. When the flatness of the insulating layer IL is reduced, bending of the pixel electrode 210 located on the insulating layer IL is reduced, and accordingly, a phenomenon that a specific color, not black, appears due to external light while the display apparatus 1 is in a non-emission mode, may be prevented or reduced.

Figure 5:
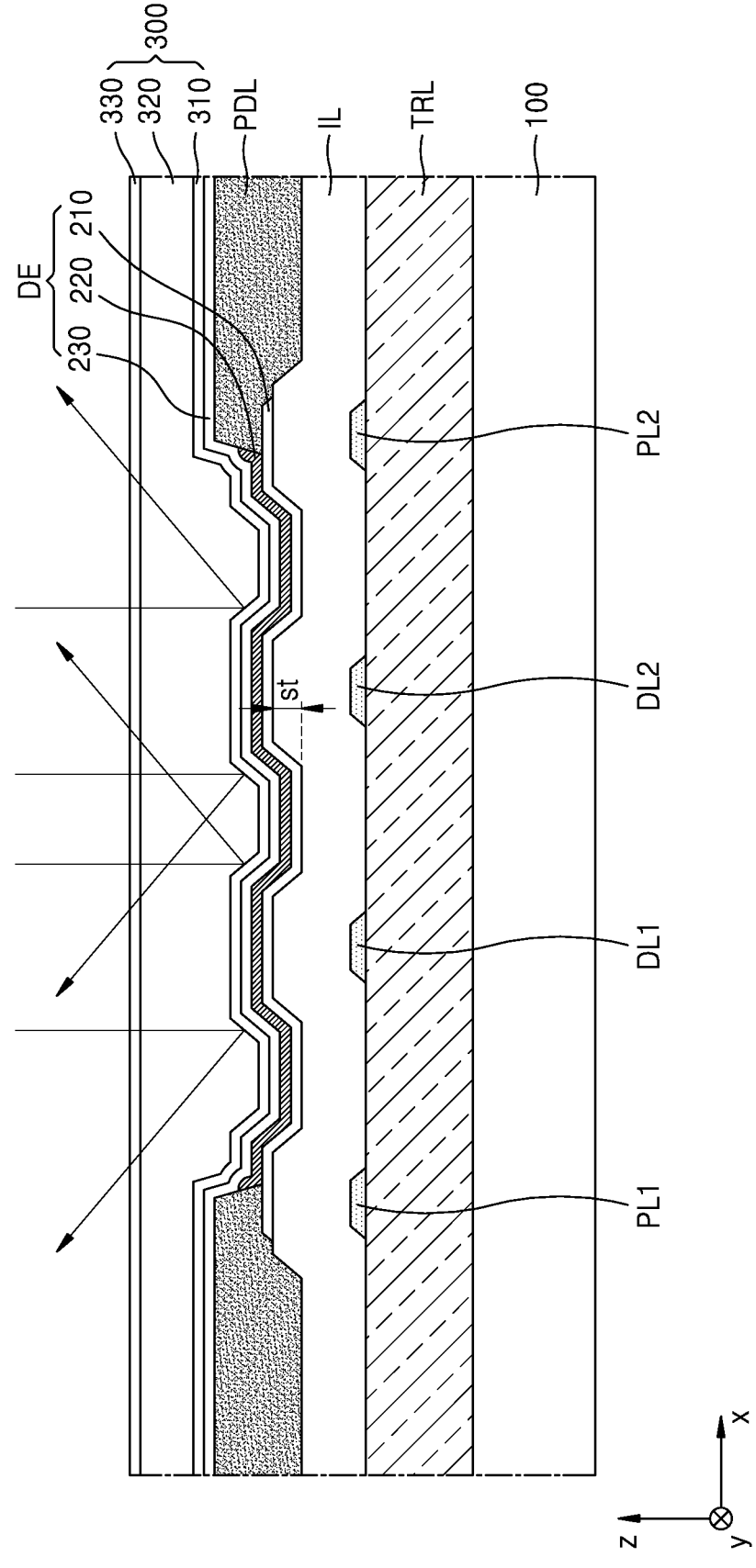
FIG. 5 is a schematic cross-sectional view of a portion of a display apparatus according to a comparative example.

FIG. 4 is a cross-sectional view of a portion of a display apparatus, taken along the line I-I' of FIG. 3, and FIG. 5 is a schematic cross-sectional view of a portion of a display apparatus according to a comparative example.

First, referring to FIG. 4, the display apparatus 1 (see FIG. 1) may include the substrate 100, a transistor layer TRL, a conductive layer CDL, the insulating layer IL, the pixel-defining layer PDL, the display element DE, and an encapsulation layer 300.

The substrate 100 may include a glass material, a ceramic material, metal, or a flexible or bendable material. In the case where the substrate 100 is flexible or bendable, the substrate 100 may include a polymer resin including polyethersulfone, polyacrylate, polyetherimide, polyethylene naphthalate, polyethylene terephthalate, polyphenylene sulfide, polyarylate, polyimide, polycarbonate, and cellulose acetate propionate.

The substrate 100 may have a single-layered structure or a multi-layered structure of the above materials, and may further include an inorganic layer in the case of the multi-layered structure. According to some embodiments, the substrate 100 may have a structure of an organic material/an inorganic material/an organic material.

Figure 8:
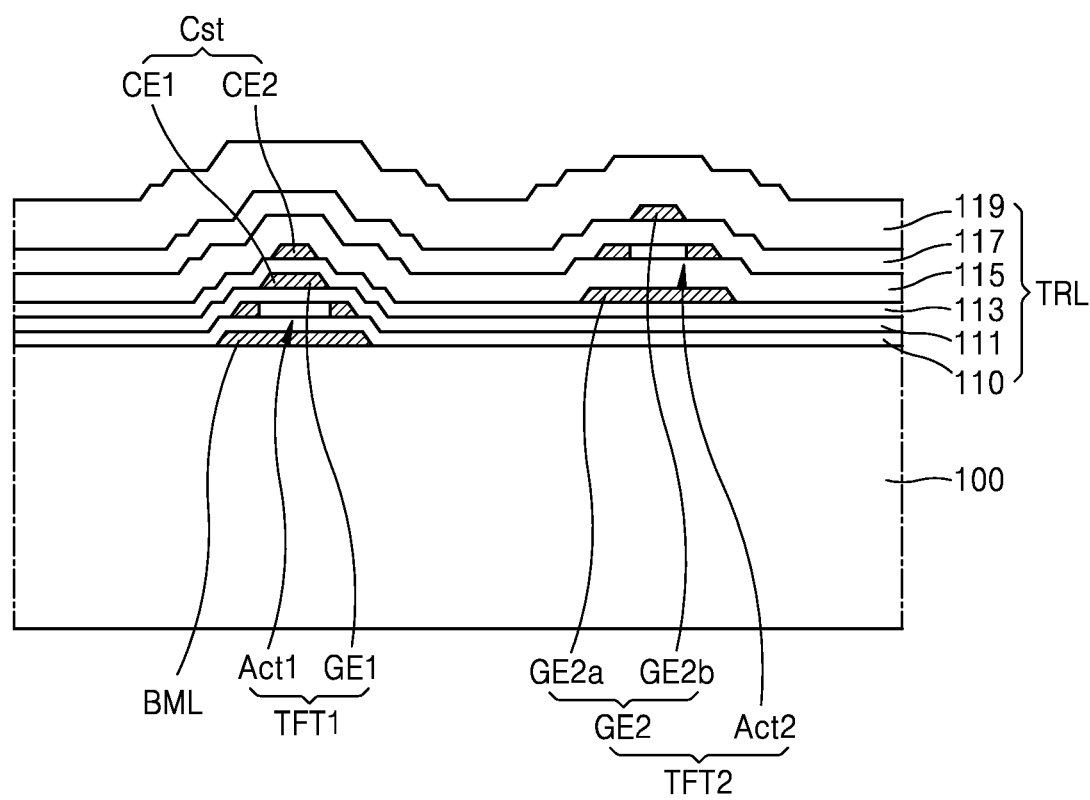
FIG. 8 is a schematic cross-sectional view of a transistor layer according to some embodiments.

The transistor layer TRL may be located on the substrate 100. As shown in FIG. 8 below, the transistor layer TRL may include a plurality of thin-film transistors and a storage capacitor. Each of the plurality of thin-film transistors may include a semiconductor layer and a gate electrode overlapping a portion of the semiconductor layer. The transistor layer TRL may include insulating layers located between the semiconductor layer and the gate electrode.

The conductive layer CDL may be located on the transistor layer TRL. The conductive layer CDL may include the first data line DL1, the second data line DL2, the first auxiliary electrode AE1, the second auxiliary electrode AE2, the first power line PL1, and the second power line PL2. The conductive layer CDL may include a conductive material including molybdenum (Mo), aluminum (Al), copper (Cu), and titanium (Ti) and have a single-layered structure or a multi-layered structure including the above materials. According to some embodiments, the conductive layer CDL may have a multi-layered structure of Ti/Al/Ti.

The insulating layer IL may be located on the conductive layer CDL. The insulating layer IL may include a single layer or a multi-layer including an organic material. The insulating layer IL may include a general-purpose polymer such as benzocyclobutene (BCB), polyimide, hexamethyldisiloxane (HMDSO), polymethylmethacrylate (PMMA) or polystyrene (PS), polymer derivatives having a phenol-based group, an acryl-based polymer, an imide-based polymer, an aryl ether-based polymer, an amide-based polymer, a fluorine-based polymer, a p-xylene-based polymer, a vinyl alcohol-based polymer, or a blend thereof.

As a comparative example, as shown in FIG. 5, only the first data line DL1 and the second data line DL2 may be located under the insulating layer IL corresponding to the emission area EA of the display element DE. That is, the first auxiliary electrode AE1 and the second auxiliary electrode AE2 are not located. In this case, a step difference st is formed on the upper surface of the insulating layer IL due to the first data line DL1 and the second data line DL2. As described below, the pixel electrode 210 including a reflective layer is located on the insulating layer IL. The pixel electrode 210 is formed along the upper surface of the insulating layer IL, and thus, has bending due to the step difference formed on the upper surface of the insulating layer IL. Light incident from outside is reflected in various directions by the pixel electrode 210 that is bent, and even when the display element DE does not emit light, a specific color, not black, appears.

In contrast, according to some embodiments, in the case where the first auxiliary electrode AE1 and the second auxiliary electrode AE2 besides the first data line DL1 and the second data line DL2 are located under the insulating layer IL corresponding to the emission area EA of the display element DE, the flatness of the insulating layer IL may improve. That is, step differences formed on the upper surface of the insulating layer IL may be reduced by conductive patterns arranged with an equal interval. The flatness of the insulating layer IL may be reduced. When the flatness of the insulating layer IL improves, bending of the pixel electrode 210 located on the insulating layer IL may be reduced, and accordingly, a phenomenon that a specific color, not black, appears while the display element DE does not emit light, may be prevented or reduced.

Referring to FIG. 4 again, the display element DE may be located on the insulating layer IL. The display element DE may include the pixel electrode 210, an intermediate layer 220, and an opposite electrode 230.

The pixel electrode 210 may be a (semi) light-transmissive electrode or a reflective electrode. According to some embodiments, the pixel electrode 210 may include a reflective layer and a transparent or semi-transparent electrode layer on the reflective layer, wherein the reflective layer includes at least one of Ag, Mg, Al, Pt, Pd, Au, Ni, Nd, Ir, Cr, or a compound thereof. The transparent or semi-transparent electrode layer may include at least one of indium tin oxide (ITO), indium zinc oxide (IZO), zinc oxide (ZnO), indium oxide ($In_2O_3$), indium gallium oxide (IGO), or aluminum zinc oxide (AZO). According to some embodiments, the pixel electrode 210 may include ITO/Ag/ITO.

The pixel-defining layer PDL may be located on the insulating layer IL. The pixel-defining layer PDL may include an opening OP that exposes the pixel electrode 210. The emission area EA of the display element DE may be defined by the opening OP of the pixel-defining layer PDL. In addition, the pixel-defining layer PDL may prevent or reduce arcs and the like from occurring at the edges of each pixel electrode 210 by increasing a distance between the edges of each pixel electrode 210 and the opposite electrode 230 over the pixel electrode 210.

The pixel-defining layer PDL may include at least one organic insulating material from among polyimide, an acrylic resin, benzocyclobutene, a phenolic resin, and the like. The pixel-defining layer PDL may include an organic insulating material. Alternatively, the pixel-defining layer PDL may include an inorganic insulating material such as silicon nitride, silicon oxynitride, or silicon oxide. Alternatively, the pixel-defining layer PDL may include an organic insulating material and an inorganic insulating material. According to some embodiments, the pixel-defining layer PDL may include a light-blocking material and be provided in black. The light-blocking material may include carbon black, carbon nanotubes, a resin or paste including black dye, metal particles, for example, nickel, aluminum, molybdenum, and an alloy thereof, metal oxide particles (e.g., chrome oxide), or metal nitride particles (e.g., chrome nitride). In the case where the pixel-defining layer PDL includes a light-blocking material, external light reflection by a metal structure arranged below the pixel-defining layer PDL may be reduced.

The intermediate layer 220 may be located in the opening OP formed by the pixel-defining layer PDL. The intermediate layer 220 may include an organic emission layer. The organic emission layer may include an organic material including a fluorescent or phosphorous material emitting red, green, blue, or white light. The organic emission layer may include a polymer organic material or a low molecular weight organic material. Functional layers may be selectively further arranged under and on the organic emission layer, the functional layers including a hole transport layer (HTL), a hole injection layer (HIL), an electron transport layer (ETL), or an electron injection layer (EIL).

The intermediate layer 220 may be arranged to correspond to the plurality of pixel electrodes 210. However, the embodiments are not limited thereto. The intermediate layer 220 may include a layer that is one body over the plurality of pixel electrodes 210. However, various modifications may be made.

The opposite electrode 230 may be a light-transmissive electrode or a reflective electrode. According to some embodiments, the opposite electrode 230 may be a transparent or semi-transparent electrode and may include a metal thin film including Li, Ca, LiF/Ca, LiF/Al, Al, Ag, Mg, or compound thereof and having a small work function. In addition, a transparent conductive oxide (TCO) such as ITO, IZO, ZnO, or $In_2O_3$ may be further located on the metal thin film. The opposite electrode 230 may be arranged over the display area and located on the intermediate layer 220 and the pixel-defining layer PDL. The opposite electrode 230 may be formed as one body over the plurality of display elements DE to correspond to the plurality of pixel electrodes 210.

Because the display element DE including an organic emission layer may be easily damaged by external moisture, oxygen or the like, the encapsulation layer 300 may cover and protect the display element DE. The encapsulation layer 300 may be located on the opposite electrode 230, may cover the display area DA (see FIG. 1), and extend to at least a portion of the peripheral area PA (see FIG. 1). The encapsulation layer 300 may include at least one inorganic encapsulation layer and/or at least one organic encapsulation layer. As an example, the encapsulation layer 300 includes a first inorganic encapsulation layer 310, an organic encapsulation layer 320, and a second inorganic encapsulation layer. The at least one inorganic encapsulation layer may include at least one inorganic material from among aluminum oxide, titanium oxide, tantalum oxide, hafnium oxide, zinc oxide, silicon oxide, silicon nitride, and silicon oxynitride. The at least one organic encapsulation layer may include a polymer-based material. The polymer-based material may include an acryl-based resin, an epoxy-based resin, polyimide, and polyethylene.

Figure 6:
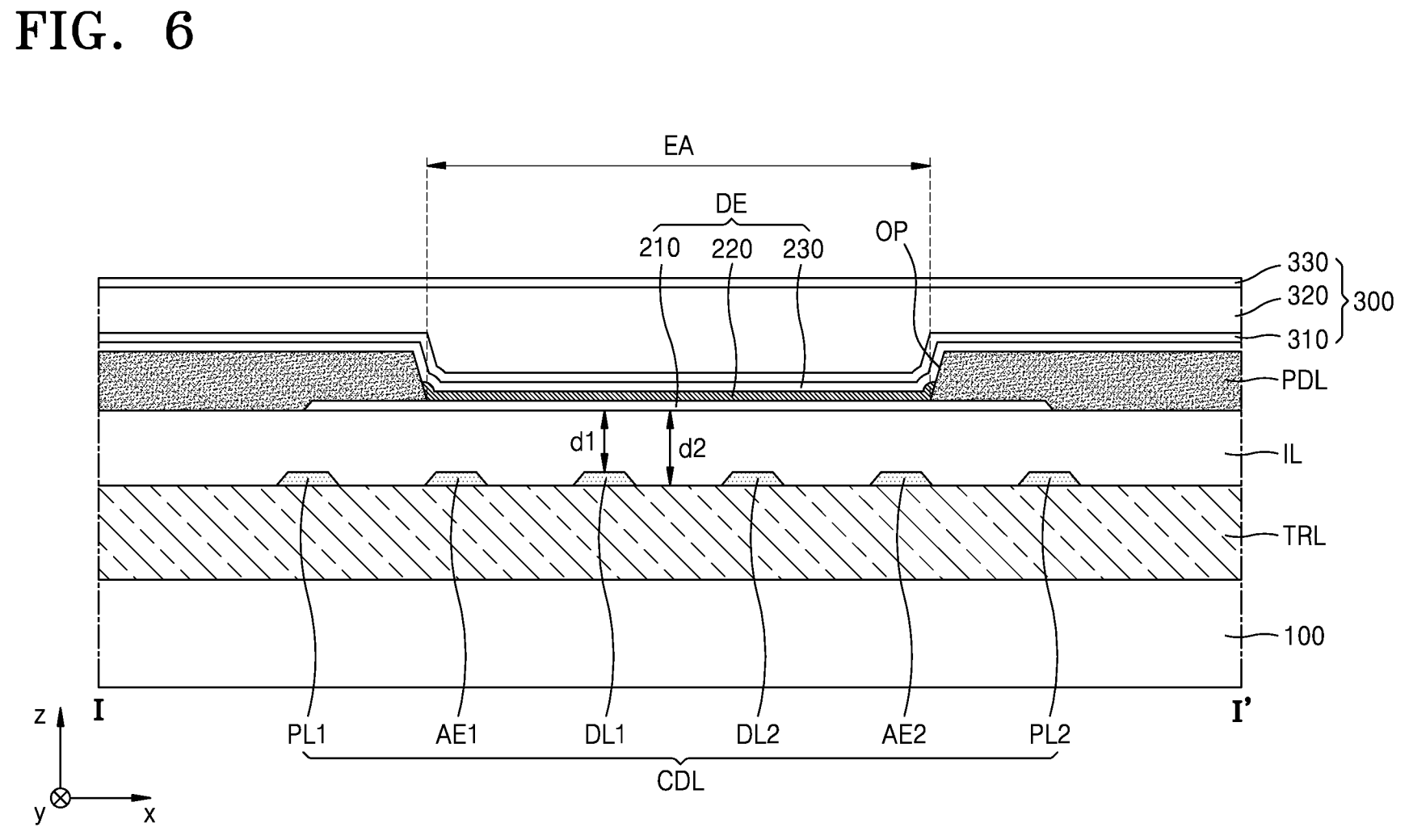

FIG. 6 is a cross-sectional view of a portion of a display apparatus, taken along the line I-I' of FIG. 3. FIG. 6 illustrates further details according to some embodiments, and is different from the embodiments described with respect to FIG. 4 with respect to the structure of the insulating layer. Hereinafter, some descriptions repeated in FIG. 4 may be omitted, and differences are mainly described.

Referring to FIG. 6, unlike FIG. 4, a step difference is not formed on the upper surface of the insulating layer IL. The step difference formed on the upper surface of the insulating layer IL may be omitted. To form the insulating layer IL, an insulating material layer may be formed on the conductive layer CDL. The upper surface of the insulating material layer may be bent along the conductive layer CDL. As shown in FIGS. 17 to 21, when the insulating material layer is partially removed by using a slit mask, the flatness of the insulating layer IL may improve. That is, the step difference may not be formed on the upper surface of the insulating layer IL.

According to some embodiments, a first distance d1 between the upper surface of the first data line DL1 and the upper surface of the transistor layer TRL may be less than a second distance d2 between the upper surface of the insulating layer IL and the upper surface of the transistor layer TRL. In this case, the flatness of the insulating layer IL improves, bending of the pixel electrode 210 located on the insulating layer IL is reduced, and accordingly, a phenomenon that a specific color, not black, appears while the display element DE does not emit light, may be reduced.

Figure 7:
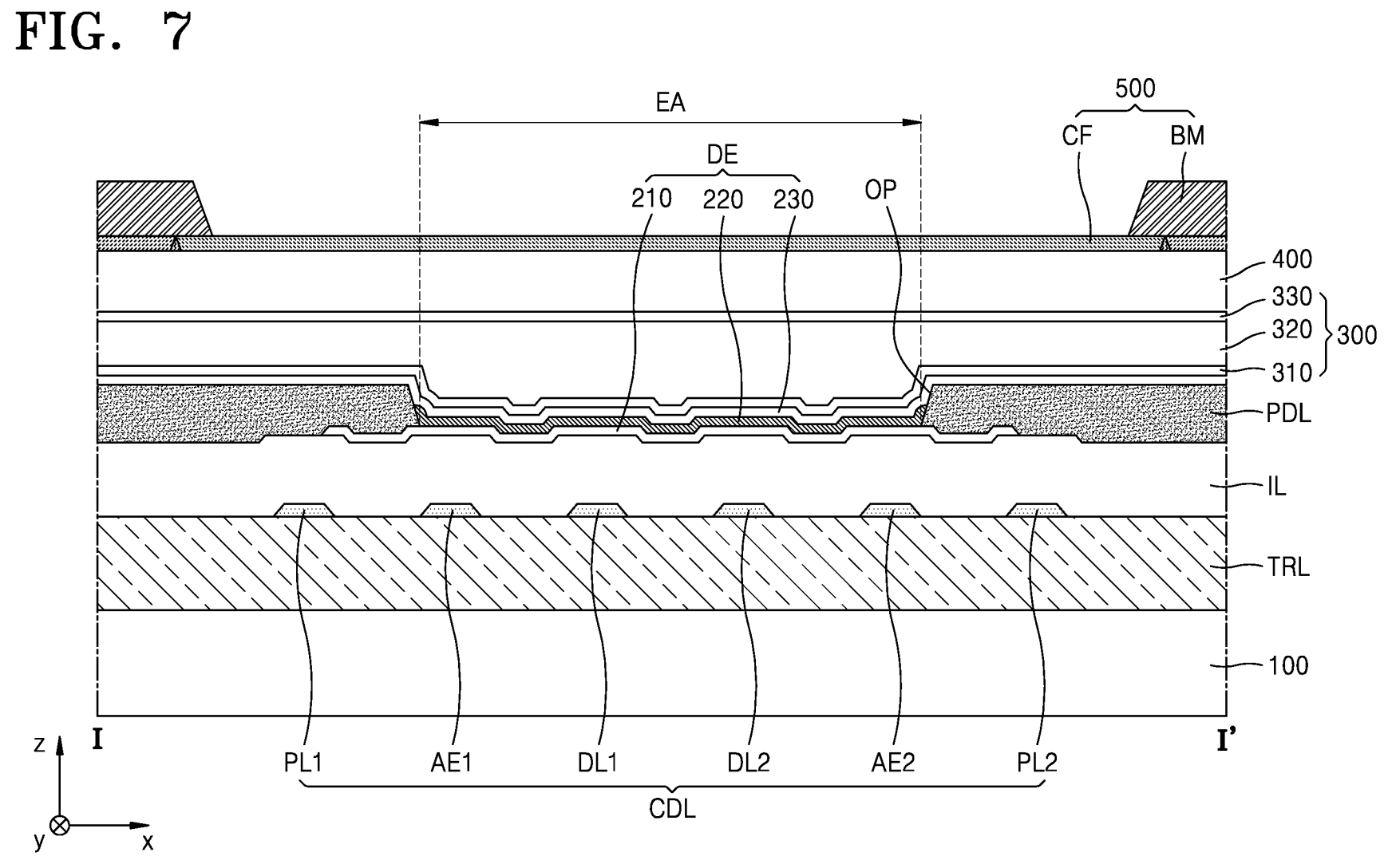

FIG. 7 is a cross-sectional view of a portion of a display apparatus, taken along the line I-I' of FIG. 3. FIG. 7 is a modified example of FIG. 4 and is different from FIG. 4 in the structures of a touch-sensing layer 400 and an optical functional layer 500. Hereinafter, descriptions repeated in FIG. 4 are omitted, and differences are mainly described.

Referring to FIG. 7, the display apparatus 1 (see FIG. 1) may include the touch-sensing layer 400 and the optical functional layer 500.

The touch-sensing layer 400 may be located on the encapsulation layer 300. Alternatively, the touch-sensing layer 400 may be formed separately, and then attached to the encapsulation layer 300 through an adhesive layer such as an optically clear adhesive (OCA). According to some embodiments, as shown in FIG. 7, the touch-sensing layer 400 may be directly formed on the encapsulation layer 300. In this case, the adhesive layer may not be located between the touch-sensing layer 400 and the encapsulation layer 300.

The touch-sensing layer 400 may obtain coordinate information corresponding to an external input, for example, a touch event. The touch-sensing layer 400 may include a sensing electrode and signal lines connected to the sensing electrode. The touch-sensing layer 400 may sense an external input by using a self-capacitance method or a mutual capacitance method.

The optical functional layer 500 may be formed on the touch-sensing layer 400. The optical functional layer 500 may include an anti-reflection layer. The anti-reflection layer may reduce reflectivity of light (external light) incident toward the display apparatus 1 from outside.

According to some embodiments, as shown in FIG. 7, the optical functional layer 500 may include a light-blocking layer BM and a color filter layer CF.

The light-blocking layer BM may expose at least a portion of the color filter layer CF. The light-blocking layer BM is a black matrix and may be a layer configured to color clarity and contrast. The light-blocking layer BM may include at least one of black pigment, black dye, or black particles. According to some embodiments, the light-blocking layer BM may include at least one of Cr or CrOx, Cr/CrOx, Cr/CrOx/CrNy, a resin (carbon pigment, RGB mixed pigment), graphite, non-Cr-based material and the like. Alternatively, the light-blocking layer BM may include a light-blocking material and be provided in black. The light-blocking material may include carbon black, carbon nanotubes, a resin or paste including black dye, metal particles, for example, nickel, aluminum, molybdenum, and an alloy thereof, metal oxide particles (e.g., chrome oxide), or metal nitride particles (e.g., chrome nitride). In the case where the light-blocking layer BM includes a light-blocking material, external light reflection by metal structures arranged below the light-blocking layer BM may be reduced.

The color filter layers CF may transmit only light in a specific wavelength band. As an example, the specific wavelength band may be from about 450 nm to about 490 nm, from about 490 nm to about 570 nm, or from about 630 nm to about 750 nm. The color filter layers CF may reduce external light reflection in the display apparatus 1. As an example, when external light reaches the color filter layers CF, only light in a wavelength set in advance passes through the color filter layers CF and light in the other wavelength bands is absorbed in the color filter layers CF. Accordingly, among external light incident to the display apparatus 1, only light in the wavelength band set in advance passes through the color filter layers CF, and a portion of the light is reflected by the opposite electrode 230 or the pixel electrode 210 therebelow and emitted to outside. Consequently, because, among external light incident to where the pixel is located, only a portion of the external light is reflected, external light reflection may be reduced.

Though it is shown in FIG. 7 that the light-blocking layer BM is located on the color filter layers CF, the light-blocking layer BM may be located on the touch-sensing layer 400 according to some embodiments. The light-blocking layer BM may include an opening that exposes at least a portion of the upper surface of the touch-sensing layer 400, and the color filter layer CF may be located in the opening.

FIG. 8 is a schematic cross-sectional view of the transistor layer TRL according to some embodiments.

Referring to FIG. 8, the transistor layer TRL may include a first transistor TFT1, a second transistor TFT2, and the storage capacitor Cst, and insulating layers. The first transistor TFT1 may include a first gate electrode GE1 and a first semiconductor layer Act1, and the second transistor TFT2 may include a second gate electrode GE2 and a second semiconductor layer Act2. The second gate electrode GE2 may include a lower gate electrode GE2a and an upper gate electrode GE2b.

According to some embodiments, the conduction type of the first transistor TFT1 may be opposite to the conduction type of the second transistor TFT2. As an example, the first transistor TFT1 may be provided as a p-channel MOSFET, and the second transistor TFT2 may be provided as an n-channel MOSFET.

According to some embodiments, the first semiconductor layer Act1 of the first transistor TFT1 and the second semiconductor layer Act2 of the second transistor TFT2 may respectively include different materials. As an example, the first semiconductor layer Act1 may include a silicon semiconductor material, and the second semiconductor layer Act2 may include an oxide semiconductor material.

Hereinafter, the configuration included in the transistor layer TRL is described in more detail according to a stack structure with reference to FIG. 8.

A buffer layer 110 may be arranged on the substrate 100. The buffer layer 110 may include an inorganic material, an organic material, or an organic/inorganic composite material, and include a single layer or a multi-layer including an inorganic material and an organic material, the inorganic material including oxide or nitride.

A lower metal layer BML may be located between the substrate 100 and the buffer layer 110. The lower metal layer BML may include a conductive material including molybdenum (Mo), aluminum (Al), copper (Cu), and titanium (Ti) and include a single layer or a multi-layer including the above materials.

The lower metal layer BML may overlap at least a portion of the first semiconductor layer Act1. The lower metal layer BML may protect the first semiconductor layer Act1. The lower metal layer BML may be configured to receive an arbitrary (or a set or predetermined) voltage. Due to the lower metal layer BML to which an arbitrary voltage is applied, unnecessary charge may be prevented from being accumulated on the first semiconductor layer Act1 while the pixel circuit is driven, wherein the pixel circuit includes both an n-channel MOSFET and a p-channel MOSFET. As a result, the characteristics of the first transistor TFT1 including the first semiconductor layer Act1 may be stably maintained.

The first semiconductor layer Act1 may be located on the buffer layer 110. The first semiconductor layer Act1 may include amorphous silicon or polycrystalline silicon. The first semiconductor layer Act1 may include a channel region, a drain region, and a source region, the drain region and the source region being on two opposite sides of the channel region. The source region and the drain region may each be regions doped with dopants. The first semiconductor layer Act1 may include a single layer or a multi-layer.

A first gate insulating layer 111 and a second gate insulating layer 113 may be stacked over the substrate 100 to cover the first semiconductor layer Act1. The first gate insulating layer 111 and the second gate insulating layer 113 may each include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_x$). Zinc oxide ($ZnO_x$) may be zinc oxide (ZnO) and/or zinc peroxide ($ZnO_2$).

The first gate electrode GE1 (or the lower electrode CE1) may be located on the first gate insulating layer 111. The first gate electrode GE1 may include a conductive material including molybdenum (Mo), aluminum (Al), copper (Cu), and titanium (Ti) and have a single-layered structure or a multi-layered structure including the above materials.

The upper electrode GE2 and the lower gate electrode GE2a may be located on the second gate insulating layer 113. The upper electrode GE2 and the lower gate electrode GE2a may each include a conductive material including molybdenum (Mo), aluminum (Al), copper (Cu), and titanium (Ti) and have a single-layered structure or a multi-layered structure including the above materials.

The lower electrode CE1 and the upper electrode CE2 overlap each other with the second gate insulating layer 113 therebetween and constitute a capacitance. In this case, the second gate insulating layer 113 may serve as a dielectric layer of the storage capacitor Cst.

The lower gate electrode GE2a may overlap at least a portion of the second semiconductor layer Act2. The lower gate electrode GE2a may protect the second semiconductor layer Act2. The lower gate electrode may be electrically connected to the upper gate electrode GE2b.

Though it is shown in FIG. 8 that the first transistor TFT1 overlaps the storage capacitor Cst, the storage capacitor Cst may exist separately without overlapping the first transistor TFT1 according to some embodiments.

A first interlayer insulating layer 115 may be located on the second gate insulating layer 113 to cover the upper electrode GE2 and the lower gate electrode GE2a. The first interlayer insulating layer 115 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_x$). Zinc oxide ($ZnO_x$) may be zinc oxide (ZnO) and/or zinc peroxide ($ZnO_2$).

The second semiconductor layer Act2 may be located on the first interlayer insulating layer 115. The second semiconductor layer Act2 may include an oxide semiconductor material. The second semiconductor layer Act2 may include, for example, an oxide of at least one of indium (In), gallium (Ga), stannum (Sn), zirconium (Zr), vanadium (V), hafnium (Hf), cadmium (Cd), germanium (Ge), chromium (Cr), titanium (Ti), aluminum (Al), cesium (Cs), cerium (Ce), or zinc (Zn).

As an example, the second semiconductor layer Act2 may be an ITZO(InSnZnO) semiconductor layer, an IGZO(InGaZnO) semiconductor layer and the like. Because an oxide semiconductor has a wide band gap (of about 3.1 eV), a high carrier mobility, and a low leakage current, a voltage drop is not large even though a driving time is long, and thus, the oxide semiconductor has a characteristic that a brightness change due to a voltage drop may not be large even when the display apparatus is driven at low frequencies.

The second semiconductor layer Act2 may include a channel region, a drain region, and a source region, the drain region and the source region being on two opposite sides of the channel region. The second semiconductor layer Act2 may include a single layer or a multi-layer.

As described below, the lower gate electrode GE2$a$ may be located below the second semiconductor layer Act2. Because the second semiconductor layer Act2 including an oxide semiconductor material is vulnerable to light, the second semiconductor layer Act2 may be protected by the lower gate electrode GE2$a$. The lower gate electrode GE2$a$ may prevent or reduce instances of a photo current being induced to the second semiconductor layer Act2 by external light incident from above the substrate 100, and thus, prevent or reduce changes of device characteristics of the second transistor TFT2 including an oxide semiconductor material.

A third gate insulating layer 117 may be located on the second semiconductor layer Act2. The third gate insulating layer 117 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_x$). Zinc oxide ($ZnO_x$) may be zinc oxide (ZnO) and/or zinc peroxide ($ZnO_2$).

Though it is shown in FIG. 8 that the third gate insulating layer 117 is arranged over the entire surface of the substrate 100 to cover the second semiconductor layer Act2, the third gate insulating layer 117 may be patterned to overlap a portion of the second semiconductor layer Act2 according to some embodiments. As an example, the third gate insulating layer 117 may be patterned to overlap the channel region of the second semiconductor layer Act2.

The upper gate electrode GE2$b$ may be located on the third gate insulating layer 117. The upper gate electrode GE2$b$ may include a conductive material including molybdenum (Mo), aluminum (Al), copper (Cu), and titanium (Ti) and have a single-layered structure or a multi-layered structure including the above materials.

A second interlayer insulating layer 119 may be located on the third gate insulating layer 117 to cover the upper gate electrode GE2$b$. The second interlayer insulating layer 119 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_x$). Zinc oxide ($ZnO_x$) may be zinc oxide (ZnO) and/or zinc peroxide ($ZnO_2$).

Figure 9:
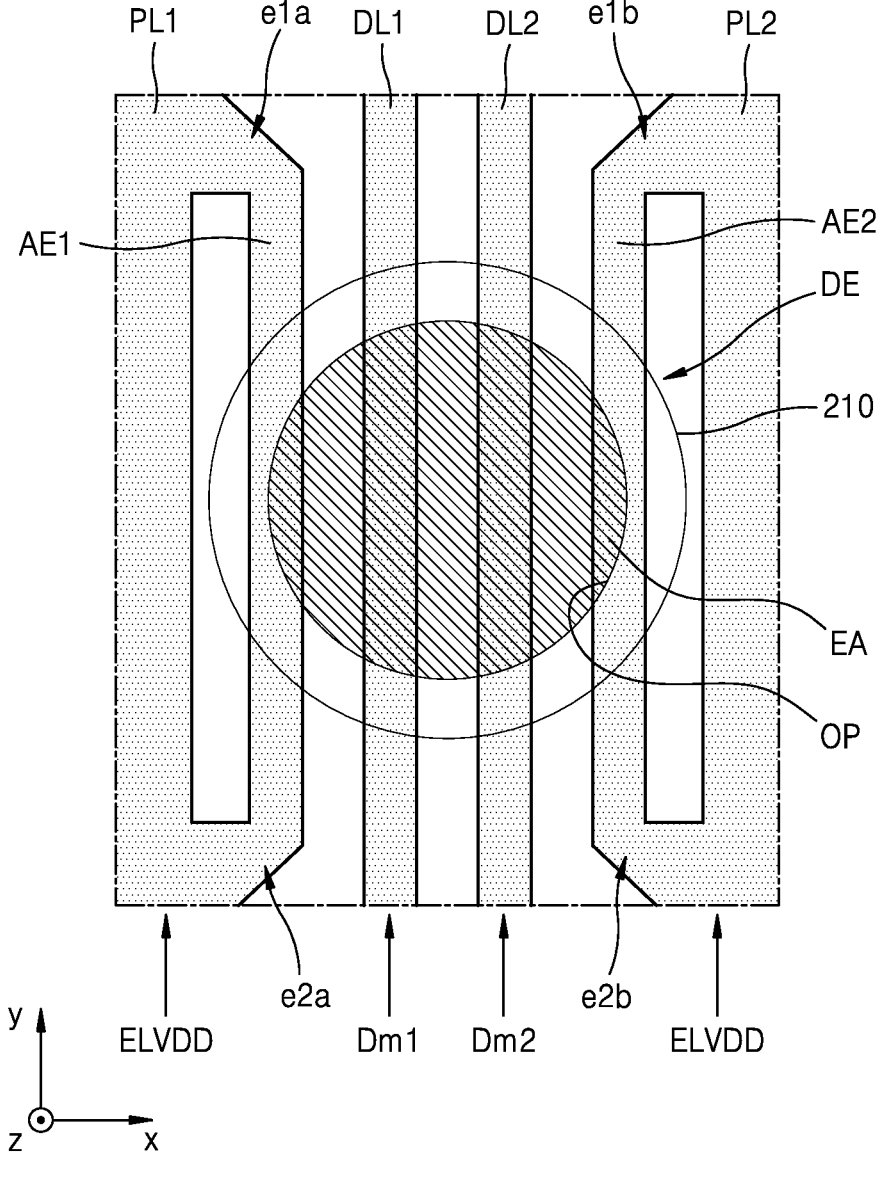
FIG. 9 is an enlarged plan view of a display apparatus according to some embodiments.

FIG. 9 is an enlarged plan view of a display apparatus according to some embodiments. FIG. 9 illustrates further details according to some embodiments and is different from the embodiments described with respect to FIG. 3 in terms of the structure of the auxiliary electrodes. Hereinafter, descriptions repeated in FIG. 3 may be omitted, and differences are mainly described.

Referring to FIG. 9, the first auxiliary electrode AE1 may include a first end e1$a$ and a second end e2$a$. The second auxiliary electrode AE2 may include a first end e1$b$ and a second end e2$b$. At least one of the first end e1$a$ or the second end e2$a$ of the first auxiliary electrode AE1 may be coupled to the first power line PL1, and at least one of the first end e1$b$ or the second end e2$b$ of the second auxiliary electrode AE2 may be coupled to the second power line PL2.

As an example, as shown in FIG. 9, all of the first end e1$a$ and the second end e2$a$ of the first auxiliary electrode AE1 may be coupled to the first power line PL1, and all of the first end e1$b$ and the second end e2$b$ of the second auxiliary electrode AE2 may be coupled to the second power line PL2.

According to some embodiments, as shown in FIG. 3, the first end e1$a$ of the first auxiliary electrode AE1 may not be coupled to the first power line PL1, and only the second end e2$a$ of the first auxiliary electrode AE1 may be coupled to the first power line PL1. The first end e1$b$ of the second auxiliary electrode AE2 may not be coupled to the second power line PL2, and only the second end e2$b$ of the second auxiliary electrode AE2 may be coupled to the second power line PL2.

Figure 10:
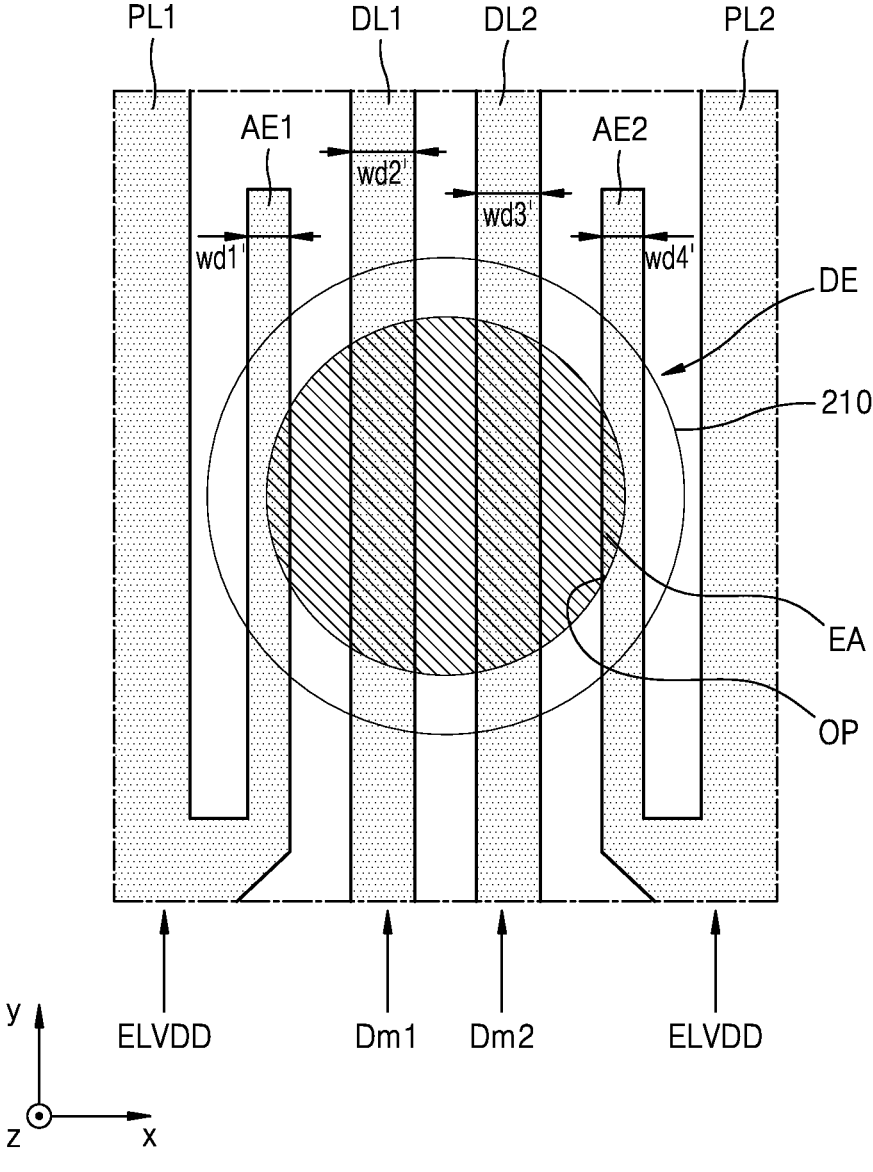
FIG. 10 is an enlarged plan view of a display apparatus according to some embodiments.

FIG. 10 is an enlarged plan view of a display apparatus according to some embodiments. FIG. 10 illustrates further details according to some embodiments, and is different from the embodiments described with respect to FIG. 3 in the structure of the auxiliary electrodes. Hereinafter, descriptions repeated in FIG. 3 may be omitted, and differences are mainly described.

Referring to FIG. 10, unlike FIG. 3, the width of each of the first data line DL1 and the second data line DL2 may be different from the width of each of the first auxiliary electrode AE1 and the second auxiliary electrode AE2.

As an example, the width of each of the first data line DL1 and the second data line DL2 may be greater than the width of each of the first auxiliary electrode AE1 and the second auxiliary electrode AE2. That is, a first width wd1' of the first auxiliary electrode AE1 may be less than a second width wd2' of the first data line DL1. A fourth width wd4' of the second auxiliary electrode AE2 may be less than a third width wd3' of the second data line DL2.

Figure 11:
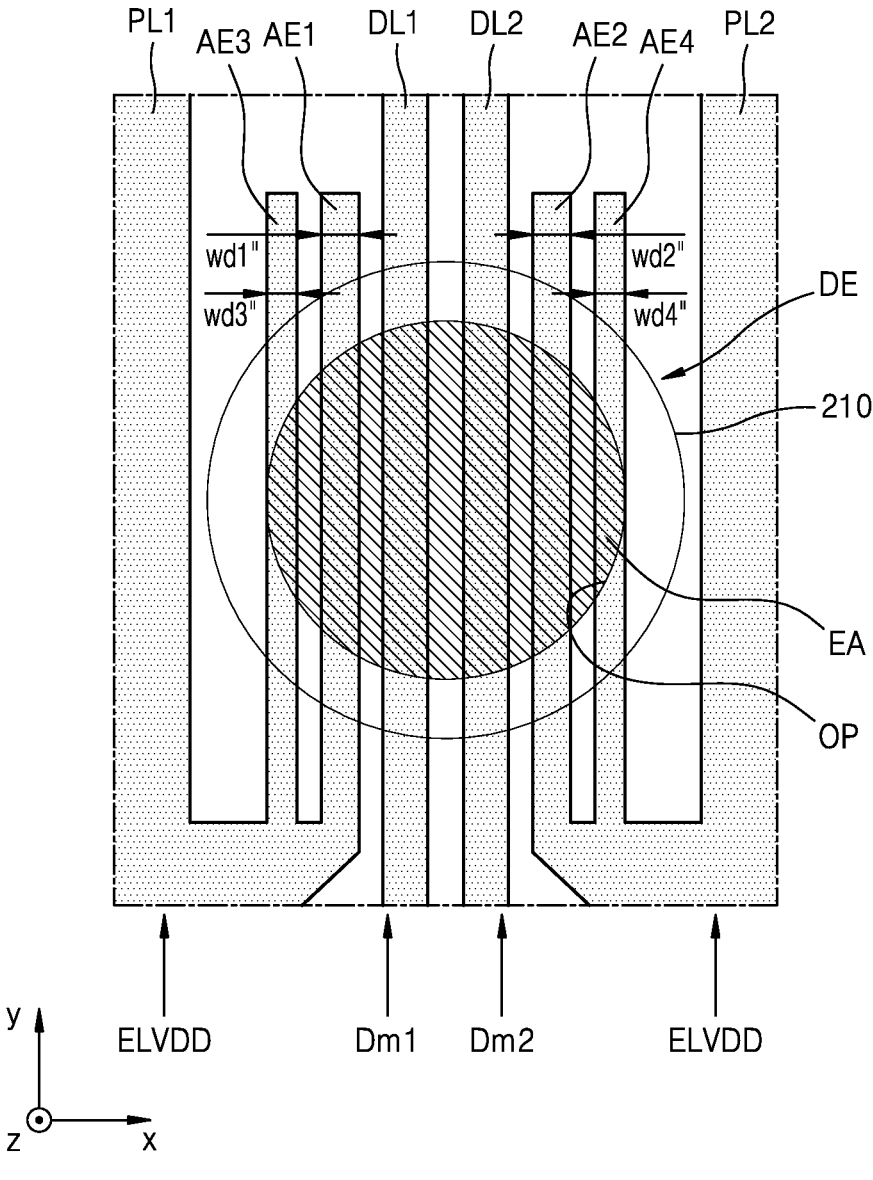
FIG. 11 is an enlarged plan view of a display apparatus according to some embodiments.

FIG. 11 is an enlarged plan view of the display apparatus 1 according to some embodiments. FIG. 11 illustrates further details according to some embodiments, and is different from the embodiments described with respect to FIG. 3 in the structure of the auxiliary electrodes. Hereinafter, descriptions repeated in FIG. 3 may be omitted, and differences are mainly described.

Referring to FIG. 11, the display apparatus 1 (see FIG. 1) may include a third auxiliary electrode AE3 and a fourth auxiliary electrode AE4. The third auxiliary electrode AE3 and the fourth auxiliary electrode AE4 may be arranged below the display element DE. The third auxiliary electrode AE3 and the fourth auxiliary electrode AE4 may be arranged between the first power line PL1 and the second power line PL2 apart from each other in the second direction (e.g., the ±x direction).

The lengthwise direction of the third auxiliary electrode AE3 is the first direction (e.g., the ±y direction) and may overlap at least a portion of the emission area EA. In other words, the third auxiliary electrode AE3 may be arranged side by side with (or in parallel to) the first data line DL1. The driving voltage ELVDD may be applied to the third auxiliary electrode AE3. The third auxiliary electrode AE3 may extend from the first power line PL1.

The lengthwise direction of the fourth auxiliary electrode AE4 is the first direction (e.g., the ±y direction) and may overlap at least a portion of the emission area EA. In other words, the fourth auxiliary electrode AE4 may be arranged side by side with (or in parallel to) the second data line DL2. The driving voltage ELVDD may be applied to the fourth auxiliary electrode AE4. The fourth auxiliary electrode AE4 may extend from the second power line PL2.

According to some embodiments, the width of each of the first auxiliary electrode AE1 and the second auxiliary electrode AE2 may be different from the width of each of the third auxiliary electrode AE3 and the fourth auxiliary electrode AE4. As an example, the width of each of the first auxiliary electrode AE1 and the second auxiliary electrode AE2 may be greater than the width of each of the third auxiliary electrode AE3 and the fourth auxiliary electrode AE4. As shown in FIG. 11, a first width wd1" of the first auxiliary electrode AE1 may be greater than a third width wd3" of the third auxiliary electrode AE3. A second width wd2" of the second auxiliary electrode AE2 may be greater than a fourth width wd4" of the fourth auxiliary electrode AE4.

Though it is shown in FIG. 11 that the width of each of the first auxiliary electrode AE1 and the second auxiliary electrode AE2 is different from the width of each of the third auxiliary electrode AE3 and the fourth auxiliary electrode AE4, the width of each of the first auxiliary electrode AE1 and the second auxiliary electrode AE2 may be substantially the same as the width of each of the third auxiliary electrode AE3 and the fourth auxiliary electrode AE4 according to some embodiments.

In addition, though it is shown in FIG. 11 that the number of auxiliary electrodes extending from each of the first power line PL1 and the second power line PL2 is 2, the number of auxiliary electrodes extending from each of the first power line PL1 and the second power line PL2 may be 3 or more, or may be one shown in FIG. 3 according to some embodiments.

Figure 12:
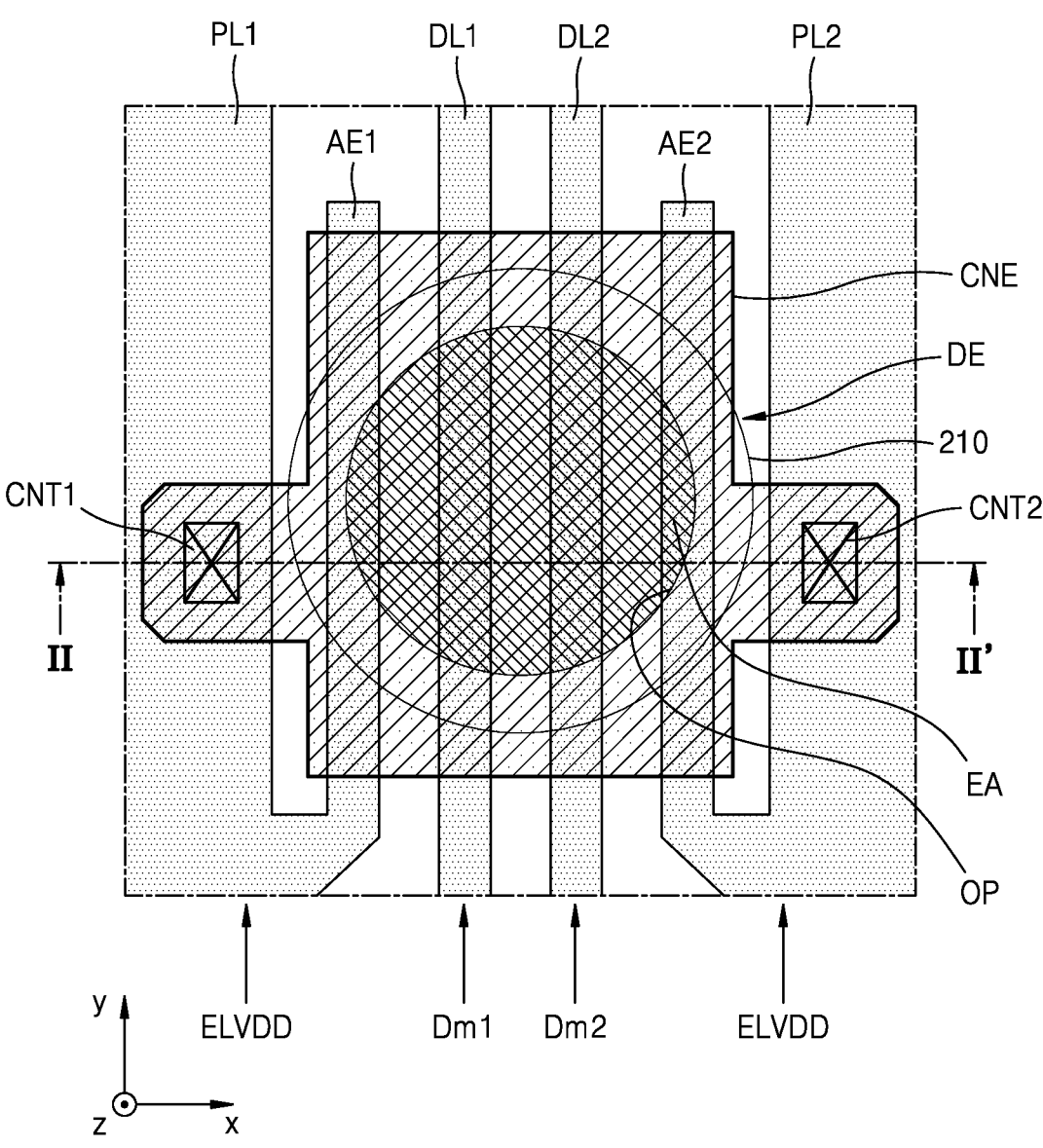
FIG. 12 is an enlarged plan view of a display apparatus according to some embodiments.

FIG. 12 is an enlarged plan view of the display apparatus 1 according to some embodiments. FIG. 12 illustrates further details according to some embodiments, and is different from the embodiments described with respect to FIG. 3 in terms of the structure of a connection electrode CNE. Hereinafter, descriptions repeated in FIG. 3 are omitted, and differences are mainly described.

Referring to FIG. 12, the display apparatus 1 (see FIG. 1) may include the connection electrode CNE. The connection electrode CNE may be located under the display element DE.

According to some embodiments, the connection electrode CNE may include a region that overlaps the emission area EA of the display element DE entirely. In this case, because the connection electrode CNE overlaps the emission area EA entirely, a flatness of a portion of the insulating layer corresponding to the emission area EA may improve. When the flatness of a portion of the insulating layer corresponding to the emission area EA improves, because the bending of the pixel electrode 210 (see FIG. 4) exposed to external light by the emission area EA is reduced, a phenomenon that a specific color, not black, appears when the display element DE does not emit light, may be reduced.

According to some embodiments, the connection electrode CNE may connect the first power line PL1 to the second power line PL2. As an example, as shown in FIG. 12, one side of the connection electrode CNE may be connected to the first power line PL1 through a first contact hole CNT1, and another side of the connection electrode CNE may be connected to the second power line PL2 through a second contact hole CNT2.

Figure 13:
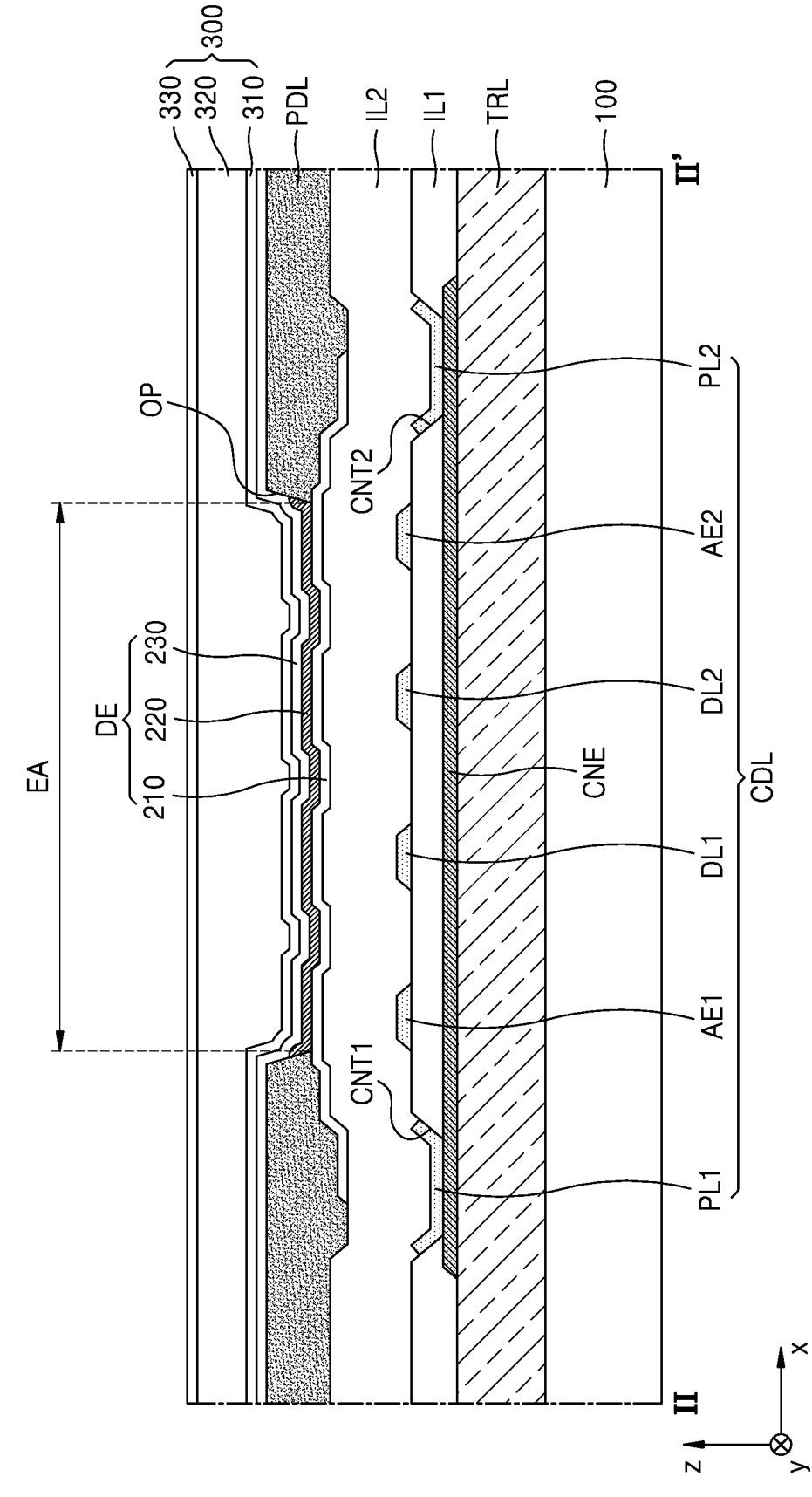
FIG. 13 is a cross-sectional view of a portion of a display apparatus, taken along the line II-II' of FIG. 12.

FIG. 13 is a cross-sectional view of a portion of the display apparatus 1, taken along the line II-II' of FIG. 12.

FIG. 13 illustrates further details according to some embodiments, and is different from the embodiments described with respect to FIG. 4 in terms of the structure of the connection electrode CNE. Hereinafter, descriptions repeated in FIG. 4 may be omitted, and differences are mainly described.

Referring to FIG. 13, the connection electrode CNE may be located on the transistor layer TRL. The connection electrode CNE may include a conductive material including molybdenum (Mo), aluminum (Al), copper (Cu), and titanium (Ti) and have a single-layered structure or a multi-layered structure including the above materials. According to some embodiments, the connection electrode CNE may have a multi-layered structure of Ti/Al/Ti.

A first insulating layer IL1 may be located on the connection electrode CNE. The first insulating layer IL1 may include the first contact hole CNT1 and the second contact hole CNT2 each exposing at least a portion of the connection electrode CNE.

The first insulating layer IL1 may include a general-purpose polymer such as benzocyclobutene (BCB), polyimide, hexamethyldisiloxane (HMDSO), polymethylmethacrylate (PMMA) or polystyrene (PS), polymer derivatives having a phenol-based group, an acryl-based polymer, an imide-based polymer, an aryl ether-based polymer, an amide-based polymer, a fluorine-based polymer, a p-xylene-based polymer, a vinyl alcohol-based polymer, or a blend thereof.

A conductive layer CDL may be located on the first insulating layer IL1. The first power line PL1 may contact the connection electrode CNE through the first contact hole CNT1, and the second power line PL2 may contact the connection electrode CNE through the second contact hole CNT2.

A second insulating layer IL2 may be located on the conductive layer CDL. The second insulating layer IL2 may include a general-purpose polymer such as benzocyclobutene (BCB), polyimide, hexamethyldisiloxane (HMDSO), polymethylmethacrylate (PMMA) or polystyrene (PS), polymer derivatives having a phenol-based group, an acryl-based polymer, an imide-based polymer, an aryl ether-based polymer, an amide-based polymer, a fluorine-based polymer, a p-xylene-based polymer, a vinyl alcohol-based polymer, or a blend thereof.

Figure 14:
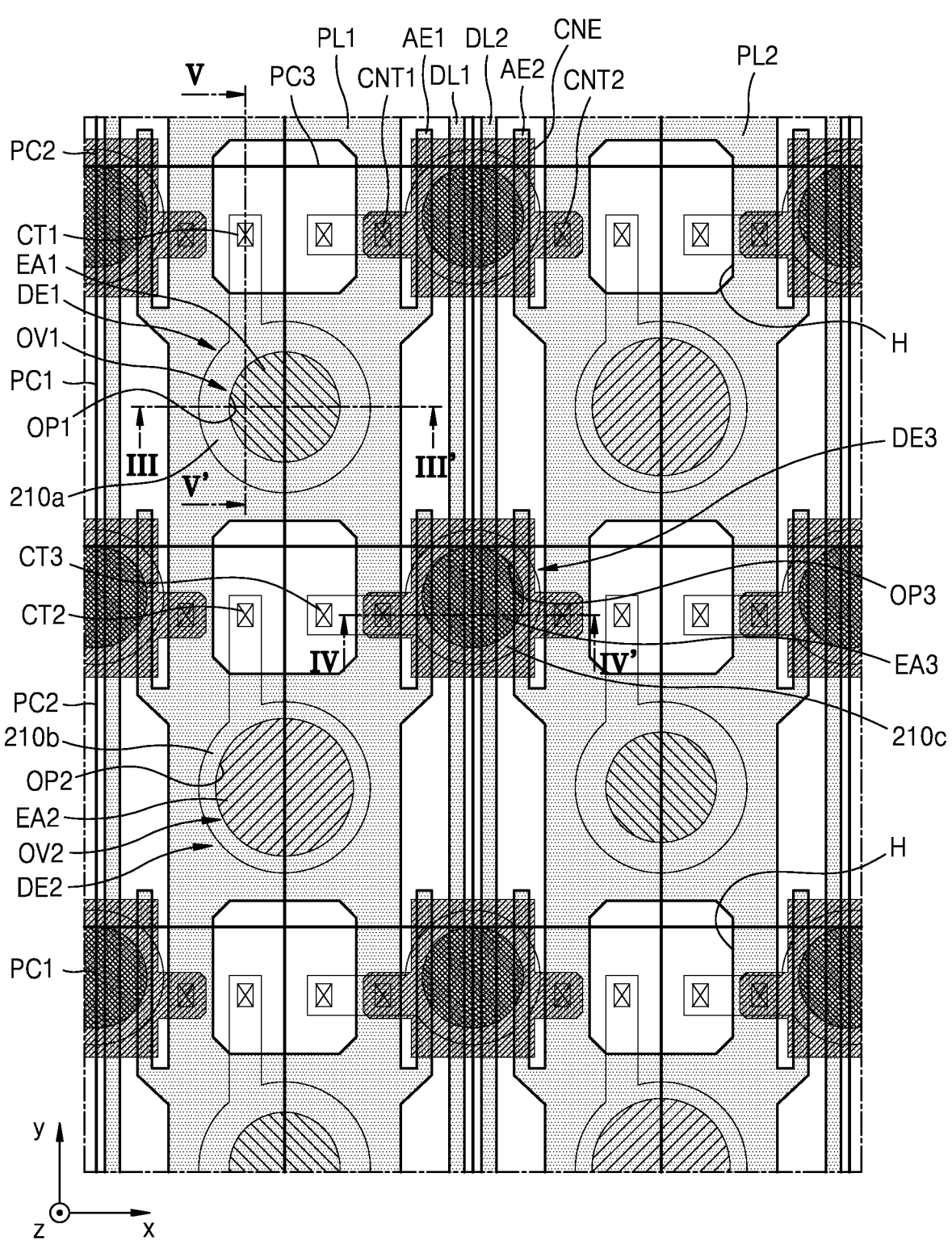
FIG. 14 is an enlarged plan view of a display apparatus according to some embodiments.

FIG. 14 is an enlarged plan view of the display apparatus 1 according to some embodiments.

Referring to FIG. 14, the display apparatus 1 (see FIG. 1) may include a plurality of first pixel circuit PC1, a plurality of second pixel circuit PC2, a plurality of third pixel circuit PC3, a plurality of first display elements DE1, a plurality of second display elements DE2, and a plurality of third display elements DE3.

Each of the first pixel circuits PC1, the second pixel circuits PC2, and the third pixel circuits PC3 may include at least one transistor and at least one storage capacitor as described above with reference to FIG. 2. The first pixel circuits PC1, the second pixel circuits PC2, and the third pixel circuits PC3 may be arranged in the first direction (e.g., the ±y direction). The first pixel circuits PC1 and the second pixel circuits PC2 may be arranged on the same column, and the third pixel circuits PC3 may be arranged on a column different from the first pixel circuits PC1 and the second pixel circuits PC2. The first pixel circuits PC1 and the second pixel circuits PC2 may be alternately arranged in the first direction (e.g., the ±y direction).

The first display element DE1 may include a first pixel electrode 210a and include a first emission area EA1 that emits light of a first color (e.g., red). The first emission area EA1 may be defined by a first opening OP1 of the pixel-defining layer PDL (see FIG. 15) that exposes at least a portion of the first pixel electrode 210a. The second display element DE2 may include a second pixel electrode 210b and include a second emission area EA2 that emits light of a second color (e.g., blue). The second emission area EA2 may be defined by a second opening OP2 of the pixel-defining layer PDL that exposes at least a portion of the second pixel electrode 210b. The third display element DE3 may include a third pixel electrode 210c and include a third emission area EA3 that emits light of a third color (e.g., green). The third emission area EA3 may be defined by a third opening OP3 of the pixel-defining layer PDL that exposes at least a portion of the third pixel electrode 210c.

The first display elements DE1, the second display elements DE2, and the third display elements DE3 may be arranged in the first direction (e.g., the ±y direction). The first display elements DE1 and the second display elements DE2 may be arranged on the same column, and the third display elements DE3 may be arranged on a column different from the first display elements DE1 and the second display elements DE2. The first display elements DE1 and the second display elements DE2 may be alternately arranged in the first direction (e.g., the ±y direction).

According to some embodiments, as shown in FIG. 14, the first display elements DE1, the second display elements DE2, and the third display elements DE3 may be arranged in a pentile configuration.

The first display elements DE1 may be respectively connected to the first pixel circuits PC1 through a first contact plug CT1, the second display elements DE2 may be respectively connected to the second pixel circuits PC2 through a second contact plug CT2, and the third display elements DE3 may be respectively connected to the third pixel circuits PC3 through a third contact plug CT3. For example, the first pixel electrodes 210a of the first display elements DE1 may be respectively connected to the first pixel circuits PC1 through the first contact plug CT1, the second pixel electrodes 210b of the second display elements DE2 may be respectively connected to the second pixel circuits PC2 through the second contact plug CT2, and the third pixel electrodes 210c of the third display elements DE3 may be respectively connected to the third pixel circuits PC3 through the third contact plug CT3.

The display apparatus 1 may include the first data line DL1, the second data line DL2, the first auxiliary electrode AE1, the second auxiliary electrode AE2, the first power line PL1, and the second power line PL2. Each of the first data line DL1, the second data line DL2, the first auxiliary electrode AE1, the second auxiliary electrode AE2, the first power line PL1, and the second power line PL2 may be provided in plurality. The description described above with reference to FIG. 3 is equally applicable to the first data line DL1, the second data line DL2, the first auxiliary electrode AE1, the second auxiliary electrode AE2, the first power line PL1, and the second power line PL2.

The first data line DL1 may extend in the first direction (e.g., a ±y direction) and overlap at least a portion of the third emission areas EA3. The first data voltage Dm1 (see FIG. 3) may be applied to the first data line DL1, and the first data line DL1 may be configured to transfer the first data voltage Dm1 to the third pixel circuits PC3 located on the same column.

The second data line DL2 may extend in the first direction (e.g., the ±y direction) and overlap at least a portion of the third emission areas EA3. The second data voltage Dm1 (see FIG. 3) may be applied to the second data line DL2, and the second data line DL2 may be configured to transfer the second data voltage Dm2 to the first pixel circuits PC1 and the second pixel circuits PC2 located on the same column.

The lengthwise direction of the first auxiliary electrode AE1 is the first direction (e.g., the ±y direction) and may overlap at least a portion of the third emission area EA3. The first auxiliary electrode AE1 may be arranged side by side with (or in parallel to) the first data line DL1. The driving voltage ELVDD (see FIG. 3) may be applied to the first auxiliary electrode AE1.

The lengthwise direction of the second auxiliary electrode AE2 is the first direction (e.g., the ±y direction) and may overlap at least a portion of the third emission area EA3. The second auxiliary electrodes AE2 may be arranged side by side with (or in parallel to) the second data line DL2. The driving voltage ELVDD may be applied to the second auxiliary electrode AE2.

The first power line PL1 and the second power line PL2 may each extend in the first direction (e.g., the ±y direction). The driving voltage ELVDD may be applied to the first power line PL1 and the second power line PL2. The first pixel circuits PC1, the second pixel circuits PC2, and the third pixel circuits PC3 arranged on columns adjacent to each other may share the first power line PL1. In other words, the first power line PL1 may be configured to transfer the driving voltage ELVDD to the first pixel circuits PC1, the second pixel circuits PC2, and the third pixel circuits PC3 arranged on the columns adjacent to each other. Though description has been made on the first power line PL1, the same description is equally applicable to the second power line PL2.

According to some embodiments, the first auxiliary electrodes AE1 may extend from one side of the first power line PL1, and the second auxiliary electrodes AE2 may extend from another side of the first power line PL1. The first auxiliary electrodes AE1 may extend from one side of the second power line PL2, and the second auxiliary electrodes AE2 may extend from another side of the second power line PL2.

According to some embodiments, the first display elements DE1 may be located on the first power line PL1, the first power line PL1 may include a plurality of first overlapping portions OV1 respectively overlapping the first emission areas EA1, entirely. The first power line PL1 may include a region overlapping the first emission area EA1 entirely. The second display elements DE2 may be located on the first power line PL1, and the first power line PL1 may include a plurality of second overlapping portions OV2 respectively overlapping the second emission areas EA2, entirely. The first power line PL1 may include a region overlapping the second emission area EA2 entirely. Though description has been made to the first power line PL1, the same description is equally applicable to the second power line PL2.

In this case, because the first power line PL1 overlaps the first emission area EA1 entirely, a flatness of a portion of the insulating layer corresponding to the first emission area EA1 may improve. When the flatness of a portion of the insulating layer corresponding to the first emission area EA1 improves, because the bending of the first pixel electrode 210a (see FIG. 4) exposed to external light by the first emission area EA1 is reduced, a phenomenon that a specific color, not black, appears when the display apparatus 1 does not emit light, may be reduced. Though description has been made to the first power line PL1 and the first emission area EA1, the description is equally applicable to the second power line PL2 and the second emission area EA2.

Figure 16:
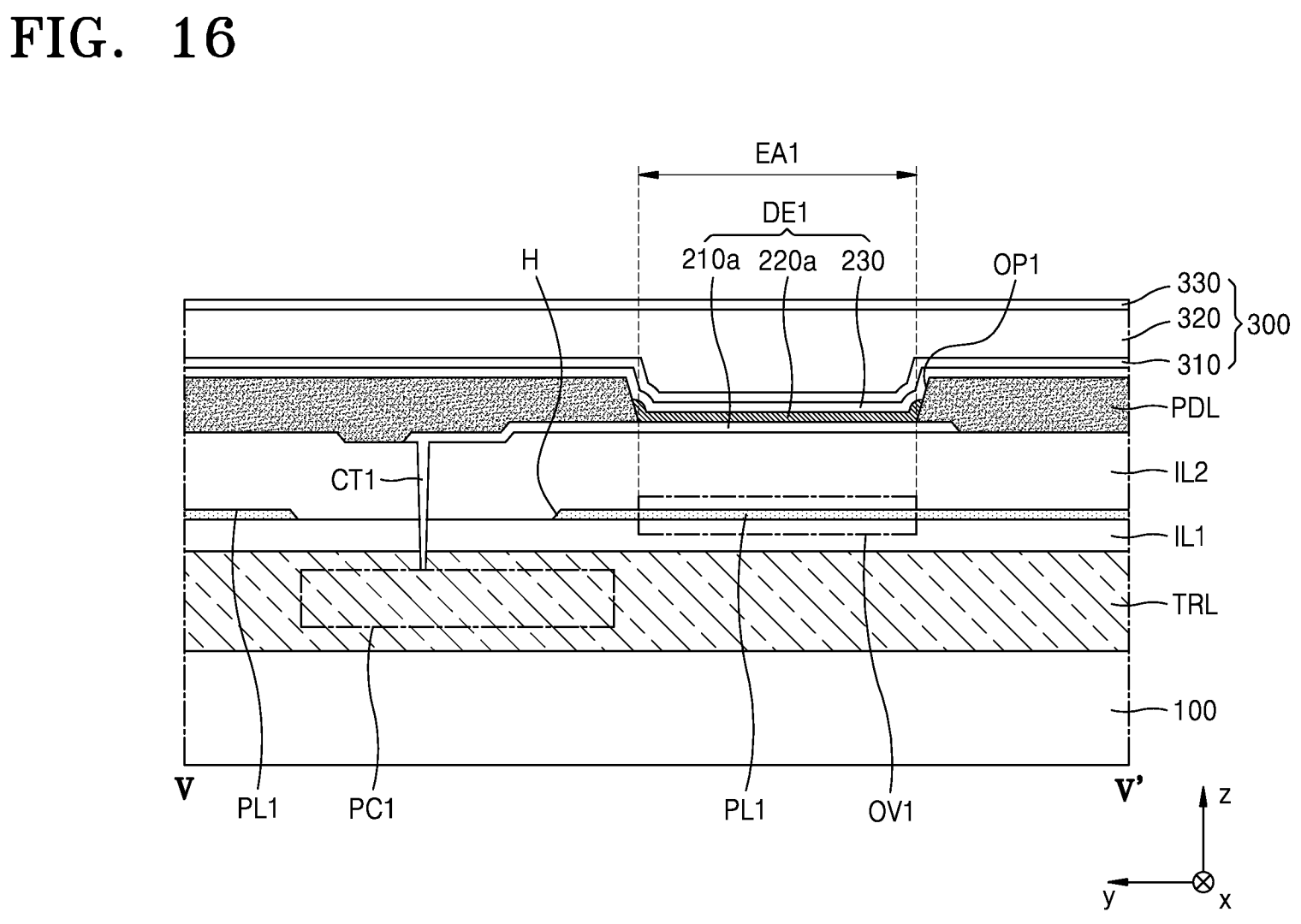

According to some embodiments, the first power line PL1 may include a plurality of holes H. As shown in FIG. 16 below, the holes H may expose a portion of the first insulating layer IL1 located under the first power line PL1. The holes H may be positioned between the first display element DE1 and the second display element DE2 adjacent to each other in the first direction (e.g., the ±y direction) among the first display elements DE1 and the second display elements DE2. Though description has been made to the first power line PL1, the same description is equally applicable to the second power line PL2.

The holes H may be adjacent to the third display elements DE3 in the second direction (e.g., the ±x direction). The holes H and the third display elements DE3 may be alternately arranged in the second direction (e.g., the ±x direction).

The third pixel circuit PC3 may be configured to receive the first data voltage Dm1 through the first data line DL1, generate the driving current having a size determined based on the driving voltage ELVDD and the first data voltage Dm1, and output the driving current to the third display element DE3. Though description has been made to the third pixel circuit PC3, the description is equally applicable to the first pixel circuit PC1 and the second pixel circuit PC2.

Figure 15:
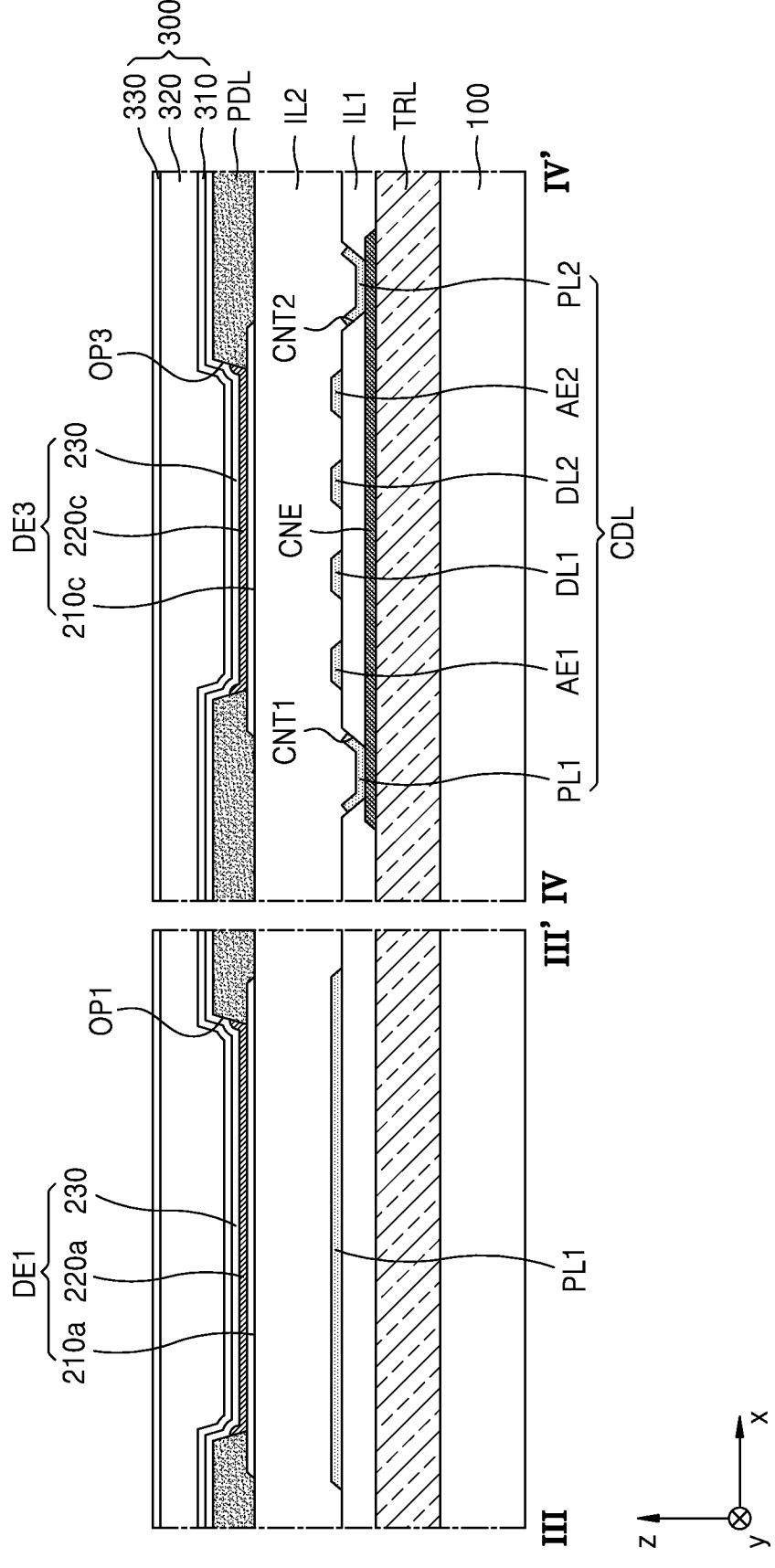
FIG. 15 is a cross-sectional view of a portion of a display apparatus, taken along the lines III-III' and IV-IV' of FIG. 14.

FIG. 15 is a cross-sectional view of a portion of the display apparatus 1, taken along the lines III-III' and IV-IV' of FIG. 14.

Referring to FIG. 15, the transistor layer TRL may be located on the substrate 100. As shown in FIG. 8 above, the transistor layer TRL may include a plurality of thin-film transistors and a storage capacitor. Each of the plurality of thin-film transistors may include a semiconductor layer and a gate electrode overlapping a portion of the semiconductor layer. The transistor layer TRL may include insulating layers located between the semiconductor layer and the gate electrode.

The connection electrode CNE may be located on the transistor layer TRL, and the first insulating layer IL1 may be located on the connection electrode CNE. The first power line PL1, the second power line PL2, the first data line DL1, the second data line DL2, the first auxiliary electrode AE1, and the second auxiliary electrode AE2 may be located on the first insulating layer IL1. The first power line PL1 may be connected to the connection electrode CNE through the first contact hole CNT1 formed in the first insulating layer IL1, and the second power line PL2 may be connected to the connection electrode CNE through the second contact hole CNT2 formed in the first insulating layer IL1.

The second insulating layer IL2 may be arranged to cover the first power line PL1, the second power line PL2, the first data line DL1, the second data line DL2, the first auxiliary electrode AE1, and the second auxiliary electrode AE2.

According to some embodiments, a step difference may not be formed on the upper surface of the second insulating layer IL2. To form the second insulating layer IL2, at least one insulating material layer may be formed on the conductive layer CDL. The upper surface of the insulating material layer may be bent along the conductive layer CDL. As shown in FIGS. 17 to 21, when the insulating material layer is partially removed by using a slit mask, the flatness of the second insulating layer IL2 may improve. That is, the step difference may not be formed on the upper surface of the second insulating layer IL2.

The first display element DE1 and the third display element DE3 may be located on the second insulating layer IL2. The first display element DE1 may include the first pixel electrode 210a, a first intermediate layer 220a, and the opposite electrode 230, and the third display element DE3 may include the third pixel electrode 210c, a third intermediate layer 220c, and the opposite electrode 230. The first intermediate layer 220a may be located in the first opening OP1 of the pixel-defining layer PDL, and the third intermediate layer 220c may be located in the third opening OP3 of the pixel-defining layer PDL. Though description has been made to the first display element DE1 and the third display element DE3, the description is equally applicable to the second display element DE2 (see FIG. 14).

The encapsulation layer 300 may be located on the first display element DE1 and the third display element DE3.

FIG. 6 is a cross-sectional view of a portion of the display apparatus 1, taken along the line V-V' of FIG. 14.

Referring to FIG. 16, the first power line PL1 may include a hole H exposing a portion of the first insulating layer IL1. The first pixel electrode 210a of the first display element DE1 may be connected to the first pixel circuit PC1 through the first contact plug CT1 passing through the hole H of the first power line PL1. Though description has been made to the first display element DE1, the description is equally applicable to the second display element DE2 and the third display element DE3.

The first power line PL1 may include the first overlapping portion OV1 overlapping the first emission area EA1 of the first display element DE1 entirely. Though description has been made to the first power line PL1 and the first display element DE1, the description is equally applicable to the second power line PL2 and the second display element DE2.

Though description has been mainly made to the display apparatus to the point, the embodiments are not limited thereto. As an example, a method of manufacturing a display apparatus to manufacture the display apparatus also falls within the scope of the disclosure.

FIGS. 17 to 21 are views for explaining a method of manufacturing a display apparatus according to some embodiments. For example, the method of manufacturing the display apparatus is described with reference to FIG. 15.

Figure 17:
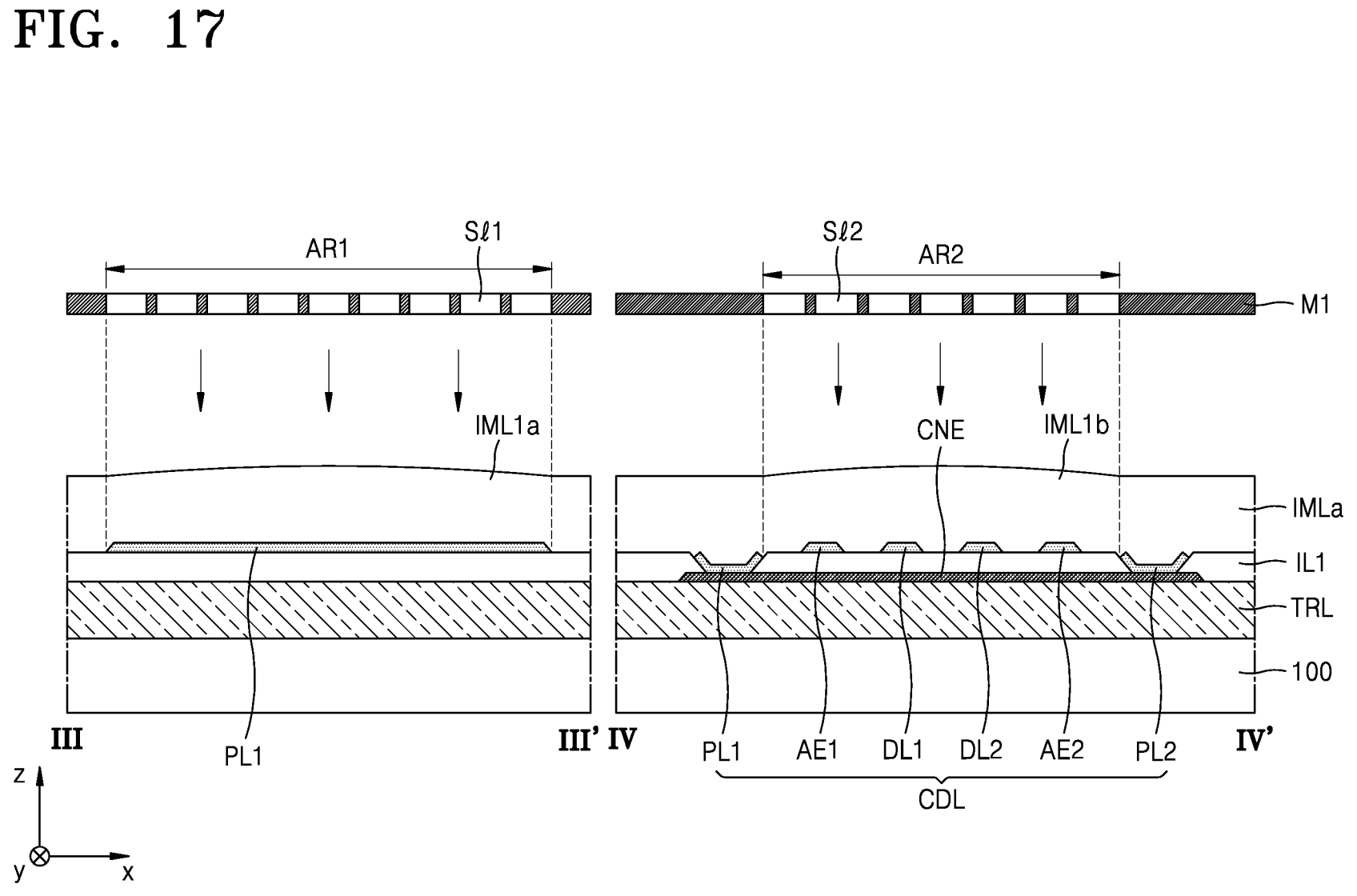

First, referring to FIG. 17, the transistor layer TRL may be formed on the substrate 100. After the transistor layer TRL is formed, the connection electrode CNE may be formed on the transistor layer TRL. After the connection electrode CNE is formed, the first insulating layer IL1 may be formed on the connection electrode CNE, wherein the first insulating layer IL1 may expose a portion of the connection electrode CNE. After the first insulating layer IL1 is formed, the conductive layer CDL may be formed on the first insulating layer IL1.

After the conductive layer CDL is formed, a first insulating material layer IMLa may be formed on the conductive layer CDL. After the first insulating material layer IMLa is formed, the first insulating material layer IMLa may be partially removed by using a first slit mask M1.

Figure 18:
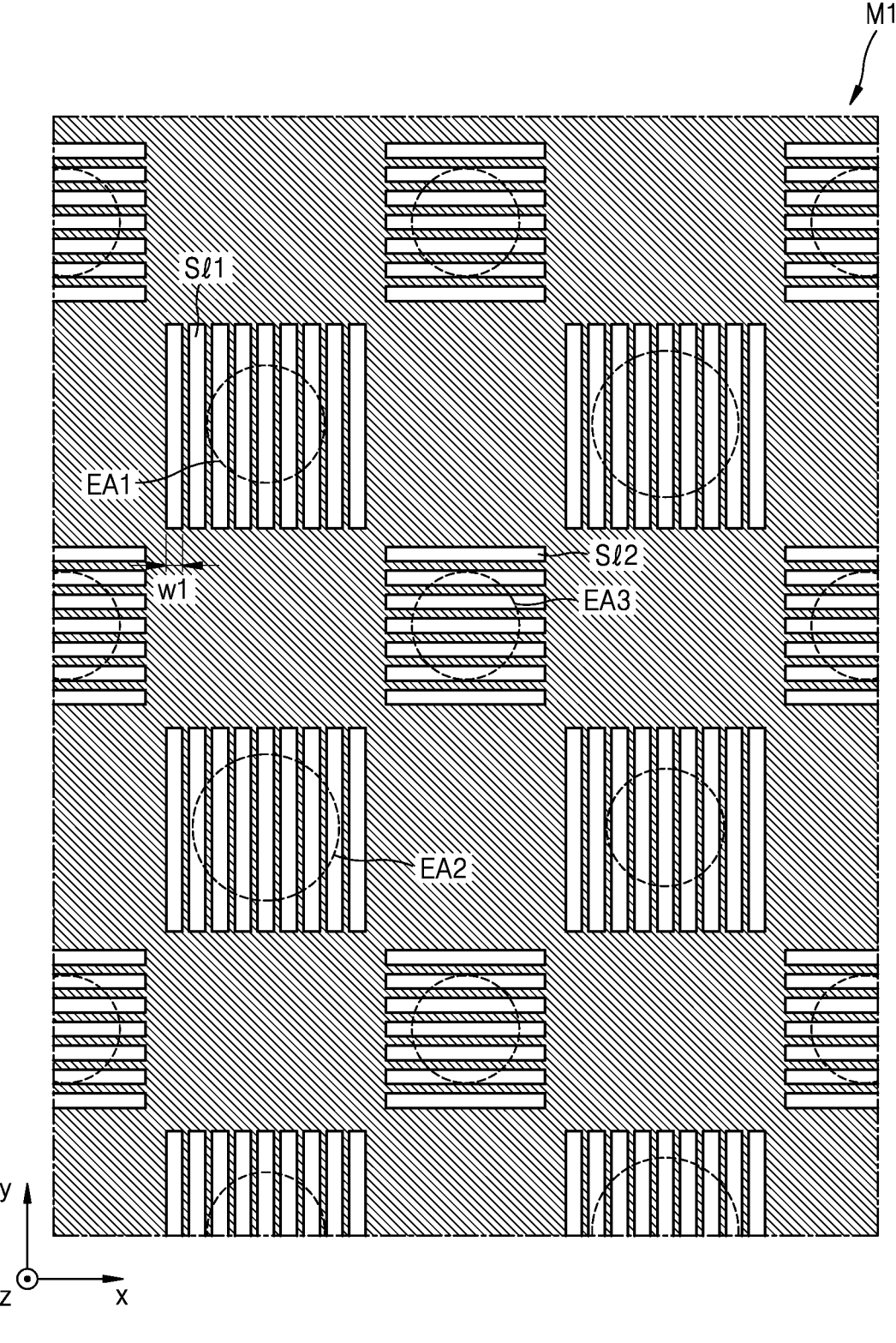

As shown in FIGS. 17 and 18, the first slit mask M1 may include a plurality of first slits Sl1 and a plurality of second slits Sl2. The first slits Sl1 may be formed in positions (e.g., a first region AR1) corresponding to the first emission area EA1 and the second emission area EA2, and the second slits Sl2 may be formed in positions (e.g., a second region AR2) corresponding to the third emission area EA3.

According to some embodiments, the lengthwise direction of each of the first slits Sl1 may be the first direction (e.g., the ±y direction), and the lengthwise direction of each of the second slits Sl2 may be the second direction (e.g., the ±x direction).

Though it is shown in FIG. 18 that the lengthwise direction of each of the first slits Sl1 is different from the lengthwise direction of each of the second slits Sl2, the lengthwise direction of each of the first slits Sl1 may be the same as the lengthwise direction of each of the second slits Sl2 according to some embodiments.

Referring to FIG. 17 again, the first insulating material layer IMLa may be partially removed by adjusting an exposure amount applied to the first insulating material layer IMLa through the first slits Sl1 and the second slits Sl2 formed in the first slit mask M1. As an example, a first part IML1a of the first insulating material layer IMLa corresponding to the first emission area EA1 and the second emission area EA2 may be partially removed, and a second part IML1b of the first insulating material layer IMLa corresponding to the third emission area EA3 may be partially removed by using the first slit mask M1.

Though it is shown in FIG. 17 that the first insulating material layer IMLa includes a positive type photoresist as an example, the first insulating material layer IMLa may include a negative type photoresist. Contrary to the case in which the first insulating material layer IMLa includes a positive type photoresist, in this case, an exposed region of the first insulating material layer IMLa remains after the developing process.

Figure 19:
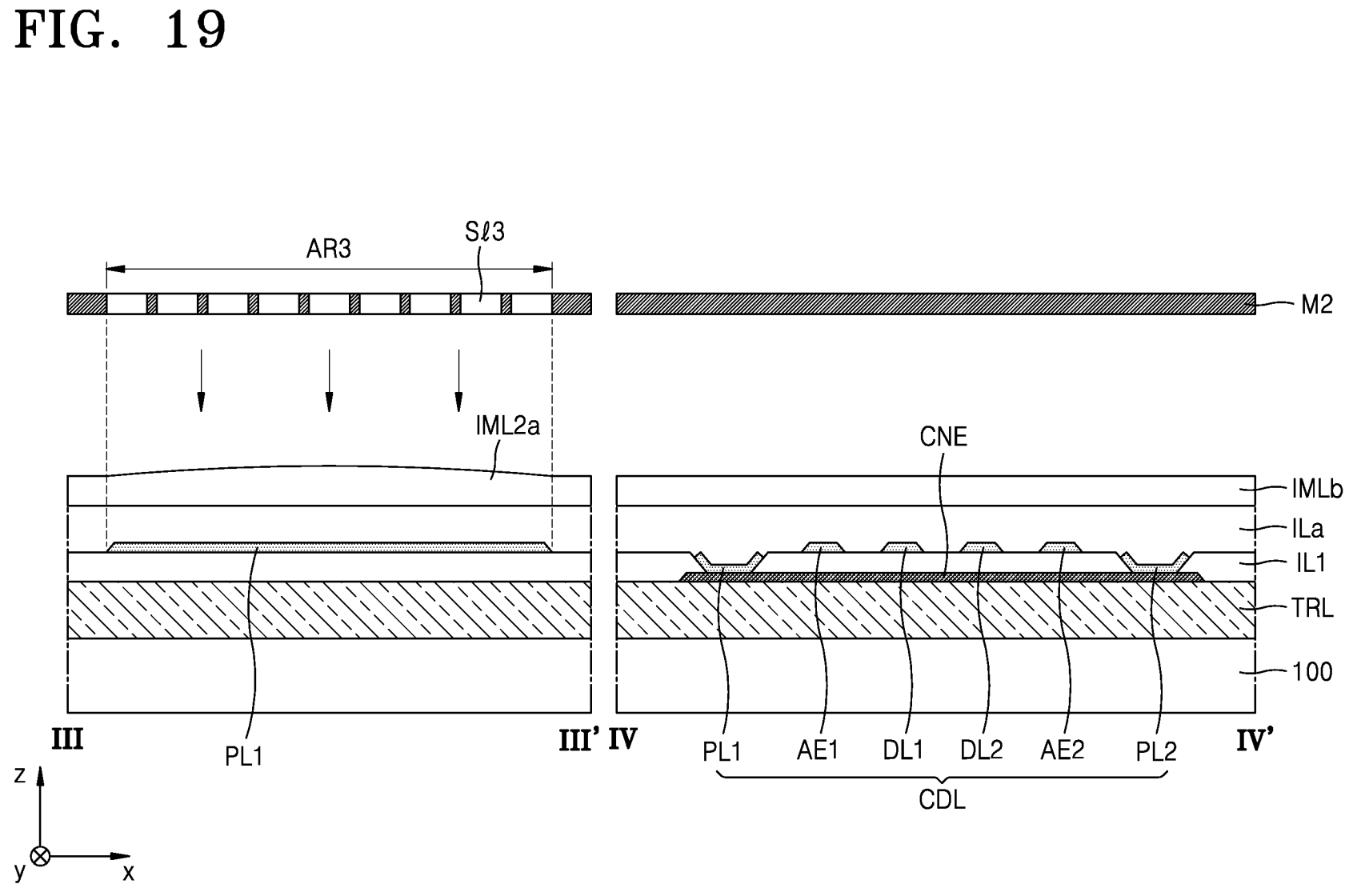

Referring to FIG. 19, a (2-1)st insulating layer ILa may be formed by partially removing the first insulating material layer IMLa. As described above, the (2-1)st insulating layer ILa may be formed by partially removing the first part IML1a of the first insulating material layer IMLa corresponding to the first emission area EA1 and the second emission area EA2, and partially removing the second part IML1b of the first insulating material layer IMLa corresponding to the third emission area EA3 by using the first slit mask M1. Because the first part IML1a of the first insulating material layer IMLa whose upper surface is bent by the conductive layer CDL located under the first insulating material layer IMLa, and the second part IML1b of the first insulating material layer IMLa are partially removed, the flatness of the (2-1)st insulating layer ILa may improve.

After the (2-1)st insulating layer ILa is formed, a second insulating material layer IMLb may be formed on the (2-1)st insulating layer ILa. After the second insulating material layer IMLb is formed, the second insulating material layer IMLb may be partially removed by using a second slit mask M2.

Figure 20:
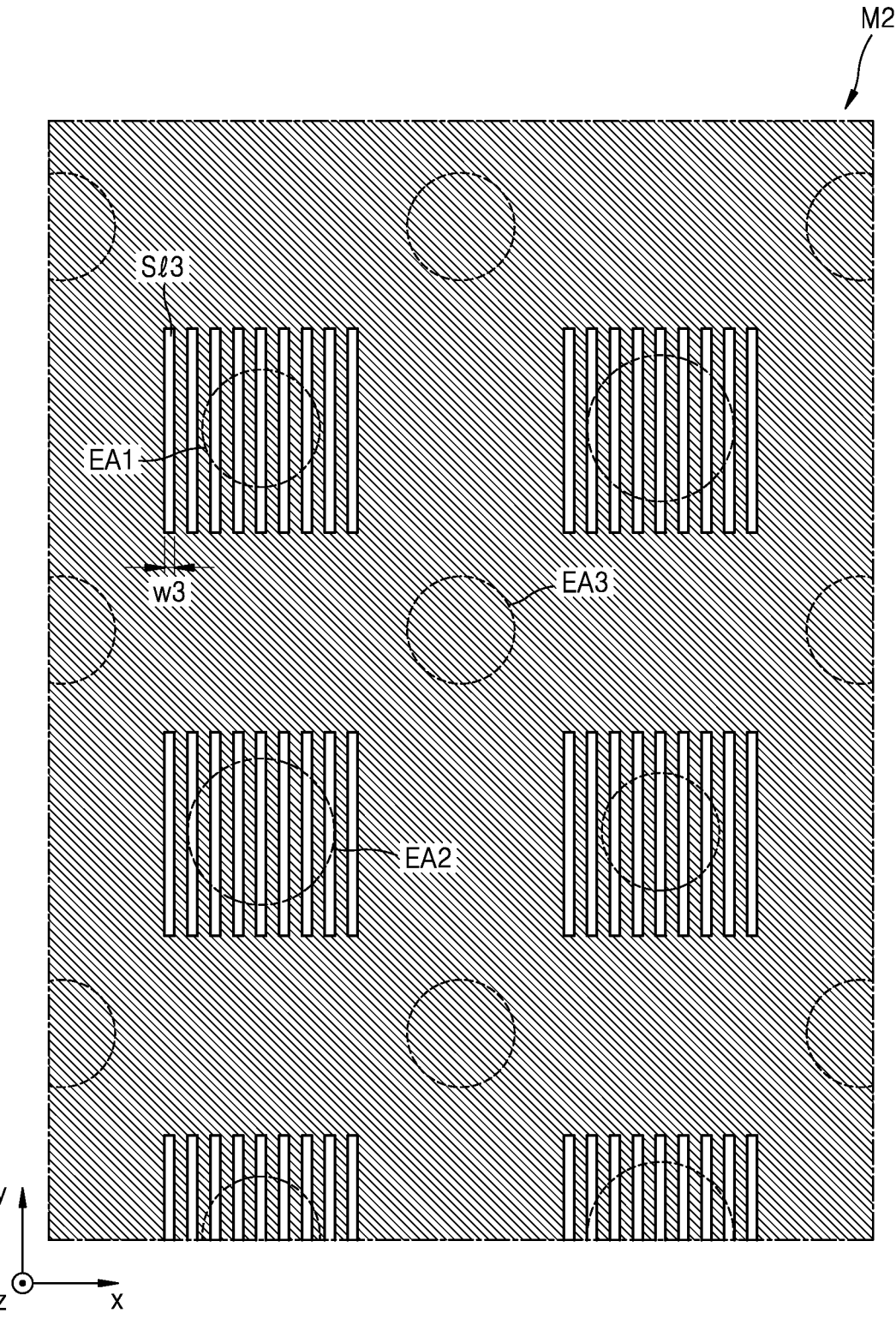

As shown in FIGS. 19 and 20, the second slit mask M2 may include a plurality of third slits Sl3. The third slits Sl3 may be formed in positions (e.g., a third region AR3) corresponding to the first emission area EA1 and the second emission area EA2.

According to some embodiments, a width w1 of each of the first slits Sl1 may be different from a width w3 of each of the third slits Sl3. As an example, the width w1 of each of the first slits Sl1 may be greater than the width w3 of each of the third slits Sl3. According to some embodiments, the width w1 of each of the first slits Sl1 may be substantially the same as the width w3 of each of the third slits Sl3.

According to some embodiments, the number of first slits Sl1 may be different from the number of third slits Sl3. According to some embodiments, the number of first slits Sl1 may be equal to the number of third slits Sl3.

Referring to FIG. 19 again, the second insulating material layer IMLb may be partially removed by adjusting an exposure amount applied to the second insulating material layer IMLb through the third slits Sl3 formed in the second slit mask M2. As an example, the first part IML2a of the second insulating material layer IMLb corresponding to the first emission area EA1 and the second emission area EA2 may be partially removed by using the second slit mask M2.

Though it is shown in FIG. 19 that the second insulating material layer IMLb includes a positive type photoresist as an example, the second insulating material layer IMLb may include a negative type photoresist. Contrary to the case in which the second insulating material layer IMLb includes a positive type photoresist, in this case, an exposed region of the second insulating material layer IMLb remains after the developing process.

In addition, though it is shown in FIG. 19 that the second slit mask M2 does not include slits formed in positions corresponding to the third emission area EA3, the second slit mask M2 may include slits formed in positions corresponding to the third emission area EA3 according to some embodiments.

In addition, though it is shown in FIGS. 17 to 20 that both the first slit mask M1 and the second slit mask M2 are used, at least one of the first slit mask M1 or the second slit mask M2 may be omitted.

In addition, though it is shown in FIGS. 17 to 20 that the insulating material layer for forming the second insulating layer IL2 is partially removed by using the slit mask when forming the second insulating layer IL2, the insulating material layer for forming the first insulating layer IL1 may be partially removed by using the slit mask when forming the first insulating layer IL1 according to some embodiments.

Figure 21:
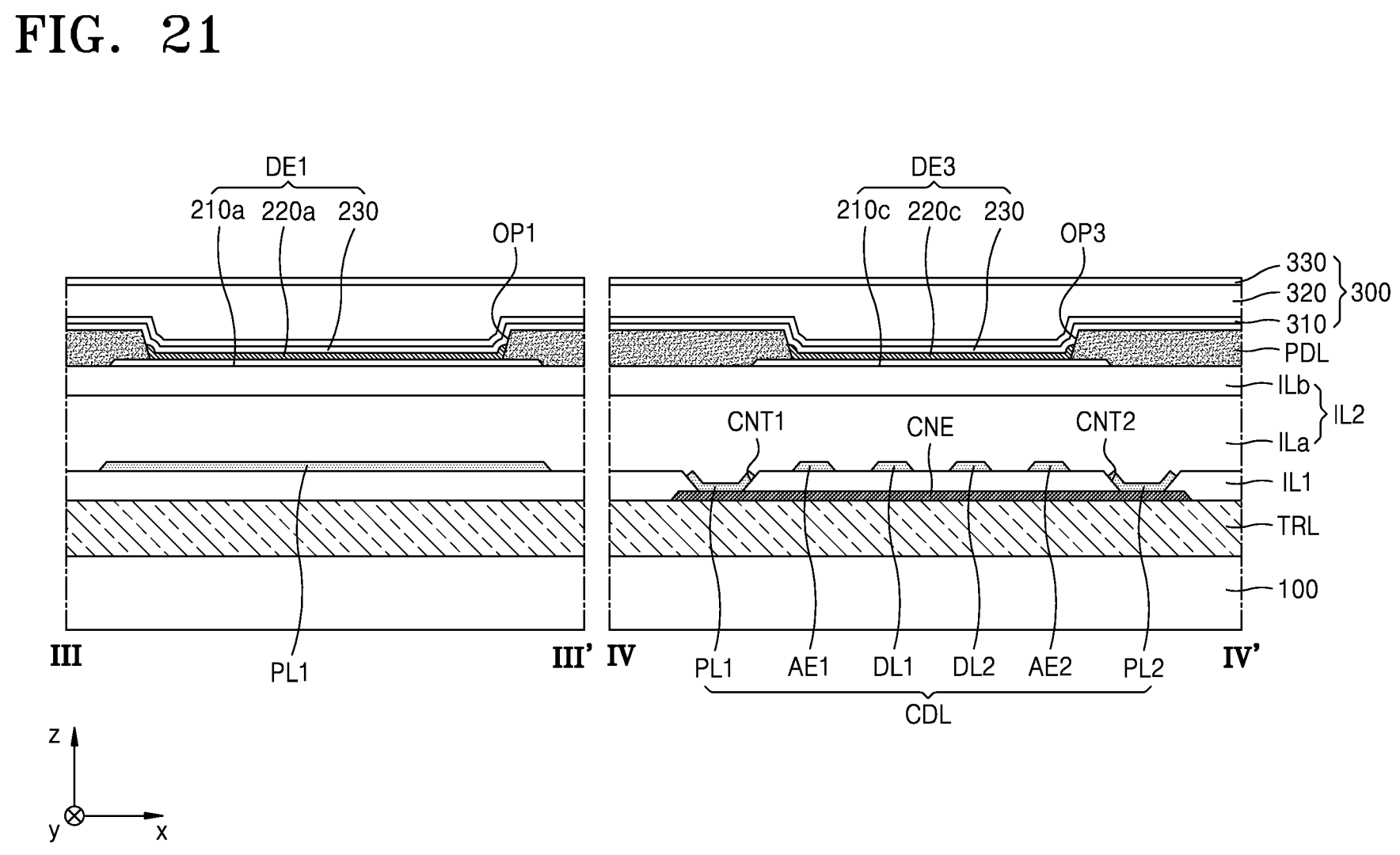

Referring to FIG. 21, a (2-2)nd insulating layer ILb may be formed by partially removing the second insulating material layer IMLb. Accordingly, the second insulating layer IL2 including the (2-1)st insulating layer ILa and the (2-2)nd insulating layer ILb may be formed. The (2-2)nd insulating layer ILb may be formed by partially removing the first part IML2a of the second insulating material layer IMLb corresponding to the first emission area EA1 and the second emission area EA2 by using the second slit mask M2. Because the first part IML2a of the second insulating material layer IMLb having the upper surface that is bent is partially removed, the flatness of the second insulating layer IL2 may improve.

After the second insulating layer IL2 is formed, the first display element DE1, the third display element DE3, and the pixel-defining layer PDL may be formed, and the encapsulation layer 300 may be formed.

According to some embodiments having the above configuration, the display apparatus including the insulating layer with an improved flatness, and the method of manufacturing the display apparatus may be implemented. However, the scope of the present disclosure is not limited by this effect.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims, and their equivalents.

What is claimed is:

1. A display apparatus comprising:
   a substrate;
   a first display element having a first emission area configured to emit light of a first color;

first and second data lines between the substrate and the first display element, extending in a first direction, and overlapping at least a portion of the first emission area; and first and second auxiliary electrodes between the substrate and the first display element, overlapping at least a portion of the first emission area, and configured to receive a driving voltage, wherein a lengthwise direction of the first and second auxiliary electrodes is the first direction, and wherein the first and second data lines are between the first and second auxiliary electrodes spaced apart from each other in a second direction.

2. The display apparatus of claim 1, further comprising first and second power lines between the substrate and the first display element, extending in the first direction, and to which the driving voltage is applied, wherein the first and second data lines and the first and second auxiliary electrodes are between the first and second power lines apart from each other in the second direction, wherein the first auxiliary electrode extends from the first power line, and wherein the second auxiliary electrode extends from the second power line.

3. The display apparatus of claim 2, further comprising a connection electrode between the substrate, and the first and second data lines, the first and second auxiliary electrodes, and having a region overlapping the first emission area entirely.

4. The display apparatus of claim 3, wherein the connection electrode connects the first power line to the second power line.

5. The display apparatus of claim 2, further comprising:

a second display element having a second emission area configured to emit light of a second color; and a third display element having a third emission area configured to emit light of a third color, wherein the first power line has a region that overlaps the second emission area entirely, and wherein the second power line has a region that overlaps the third emission area entirely.

6. The display apparatus of claim 1, further comprising a pixel circuit between the substrate and the first display element, configured to receive a data voltage through the first data line, to generate a driving current having a size determined based on the driving voltage and the data voltage, and to output the driving current to the first display element.

7. The display apparatus of claim 1, further comprising first and second power lines between the substrate and the first display element, extending in the first direction, and to which the driving voltage is applied, wherein the first auxiliary electrode has a first end and a second end, and at least one of the first end or the second end is coupled to the first power line, and wherein the second auxiliary electrode has a first end and a second end, and at least one of the first end or the second end is coupled to the second power line.

8. The display apparatus of claim 1, further comprising:

a first insulating layer between the substrate and the first display element; and a second insulating layer between the first insulating layer and the first display element, wherein the first and second data lines, and the first and second auxiliary electrodes are between the first insulating layer and the second insulating layer, and wherein a first distance between an upper surface of the first data line and an upper surface of the second insulating layer is less than a second distance between an upper surface of the first insulating layer and the upper surface of the second insulating layer.

9. The display apparatus of claim 1, further comprising:

a color filter layer on the first display element and overlapping the first emission area; and a light-blocking layer exposing at least a portion of the color filter layer.

10. The display apparatus of claim 1, wherein the first auxiliary electrode, the first data line, the second data line, and the second auxiliary electrode are spaced apart from each other in the second direction, and wherein a first separation distance between the first auxiliary electrode and the first data line, a second separation distance between the first data line and the second data line, and a third separation distance between the second auxiliary electrode and the second data line are substantially same.

11. The display apparatus of claim 1, wherein the first and second data lines have a same width as the first and second auxiliary electrodes.

12. The display apparatus of claim 1, wherein a width of each of the first and second data lines is greater than a width of each of the first and second auxiliary electrodes.

13. The display apparatus of claim 1, further comprising third and fourth auxiliary electrodes between the substrate and the first display element, overlapping at least a portion of the first emission area, and to which the driving voltage is applied, wherein a lengthwise direction of the third and fourth auxiliary electrodes is the first direction, wherein the first and second data lines and the first and second auxiliary electrodes are between the third and fourth auxiliary electrodes spaced apart from each other in the second direction.

14. The display apparatus of claim 13, wherein a width of each of the first and second auxiliary electrodes is greater than a width of each of the third and fourth auxiliary electrodes.

15. The display apparatus of claim 1, wherein the first auxiliary electrode and the first data line are symmetric with the second auxiliary electrode and the second data line with respect to a line of symmetry passing through a central portion of the first emission area.

* * * * *